(12) United States Patent
Peng et al.

(10) Patent No.: US 11,854,974 B2
(45) Date of Patent: *Dec. 26, 2023

(54) ADVANCED NODE INTERCONNECT ROUTING METHODOLOGY

(71) Applicant: Taiwan Semiconductor Manufacturing Company, Ltd., Hsinchu (TW)

(72) Inventors: Shih-Wei Peng, Hsinchu (TW); Jiann-Tyng Tzeng, Hsin Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 148 days.

This patent is subject to a terminal disclaimer.

(21) Appl. No.: 17/409,025

(22) Filed: Aug. 23, 2021

(65) Prior Publication Data
US 2021/0384127 A1    Dec. 9, 2021

Related U.S. Application Data

(63) Continuation of application No. 16/837,795, filed on Apr. 1, 2020, now Pat. No. 11,139,245.

(51) Int. Cl.
| | | |
|---|---|---|
| *H01L 23/528* | (2006.01) | |
| *G06F 30/394* | (2020.01) | |
| *H01L 21/768* | (2006.01) | |
| *H01L 23/522* | (2006.01) | |

(52) U.S. Cl.
CPC ........ *H01L 23/5283* (2013.01); *G06F 30/394* (2020.01); *H01L 21/76816* (2013.01); *H01L 21/76877* (2013.01); *H01L 23/5226* (2013.01); *H01L 23/5286* (2013.01)

(58) Field of Classification Search
CPC ............... H01L 23/528; H01L 23/5226; H01L 23/5286; H01L 23/5283; H01L 21/76816; H01L 21/76877
See application file for complete search history.

(56) References Cited

U.S. PATENT DOCUMENTS

| | | |
|---|---|---|
| 8,881,083 B1 | 11/2014 | Deng et al. |
| 9,595,536 B1 | 3/2017 | Haigh |
| 10,503,863 B2 | 12/2019 | Peng et al. |
| 11,094,685 B2 * | 8/2021 | Liaw ..................... H10B 10/18 |
| 2015/0357282 A1 | 12/2015 | Lau et al. |
| 2017/0110405 A1 | 4/2017 | Peng et al. |
| 2018/0308796 A1 | 10/2018 | Peng et al. |

* cited by examiner

*Primary Examiner* — Jaehwan Oh
*Assistant Examiner* — John M Parker
(74) *Attorney, Agent, or Firm* — FOLEY & LARDNER LLP

(57) ABSTRACT

One aspect of this description relates to an integrated circuit. In some aspects, the integrated circuit includes a first pattern metal layer, a second pattern metal layer disposed over the first pattern metal layer, wherein the second pattern metal layer includes a second plurality of metal tracks extending in a first direction, and a third pattern metal layer disposed between the first pattern metal layer and the second pattern metal layer, the third pattern metal layer including a first metal track segment and a second metal track segment shifted in a second direction from the first metal track segment, wherein the second plurality of metal tracks, and at least a portion of each of the first metal track segment and the second metal track segment are within a double cell height in the second direction.

20 Claims, 17 Drawing Sheets

1100

1102 — Form a first pattern metal layer comprising a plurality of metal tracks extending in a first direction, wherein each of the plurality of metal tracks is separated from its adjacent one of the plurality of metal tracks by a first pitch

1104 — Form a second pattern metal layer formed over the first pattern metal layer, wherein the second pattern metal layer includes a second plurality of metal tracks extending in the first direction, wherein each of the plurality of metal tracks is separated from its adjacent one of the plurality of metal tracks by a second pitch, and wherein the second plurality of metal tracks is less than 9 metal tracks

1106 — Form a third pattern metal layer disposed between the first pattern metal layer and the second pattern metal layer, the third pattern metal layer including a first metal track segment extending in a second direct ion perpendicular to the first direction, a second metal track segment extending in the second direction, wherein the second metal track segment is shifted in a second direction from the first metal track segment, and a third metal track segment extending in the second direction, wherein n the third metal track segment shifted in a second direction from the first and second metal track segments, wherein the integrated circuit is defined by a double cell height in the second direction and wherein each of the plurality of metal tracks, the second plurality of metal tracks, and at least a portion of each of the first metal track segment, the second metal track segment, and the third metal track segment are within the double cell height, wherein the double cell height is less than or equal to 240nm

FIG. 11

ADVANCED NODE INTERCONNECT ROUTING METHODOLOGY

CROSS-REFERENCE TO RELATED APPLICATION

This application is related to and claims priority under 35 U.S. § 120 as a continuation of U.S. Utility application Ser. No. 16/837,795, filed Apr. 1, 2020, titled "ADVANCED NODE INTERCONNECT ROUTING METHODOLOGY," the entire contents of which are incorporated herein by reference for all purposes.

BACKGROUND

The present application relates to circuits, and more specifically, to a routing system and methodology.

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout patterns for integrated circuits while ensuring that the standard cell layout designs and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 illustrates a flow chart of a method of forming an integrated circuit according to a layout design.

DETAILED DESCRIPTION

Figure 1:
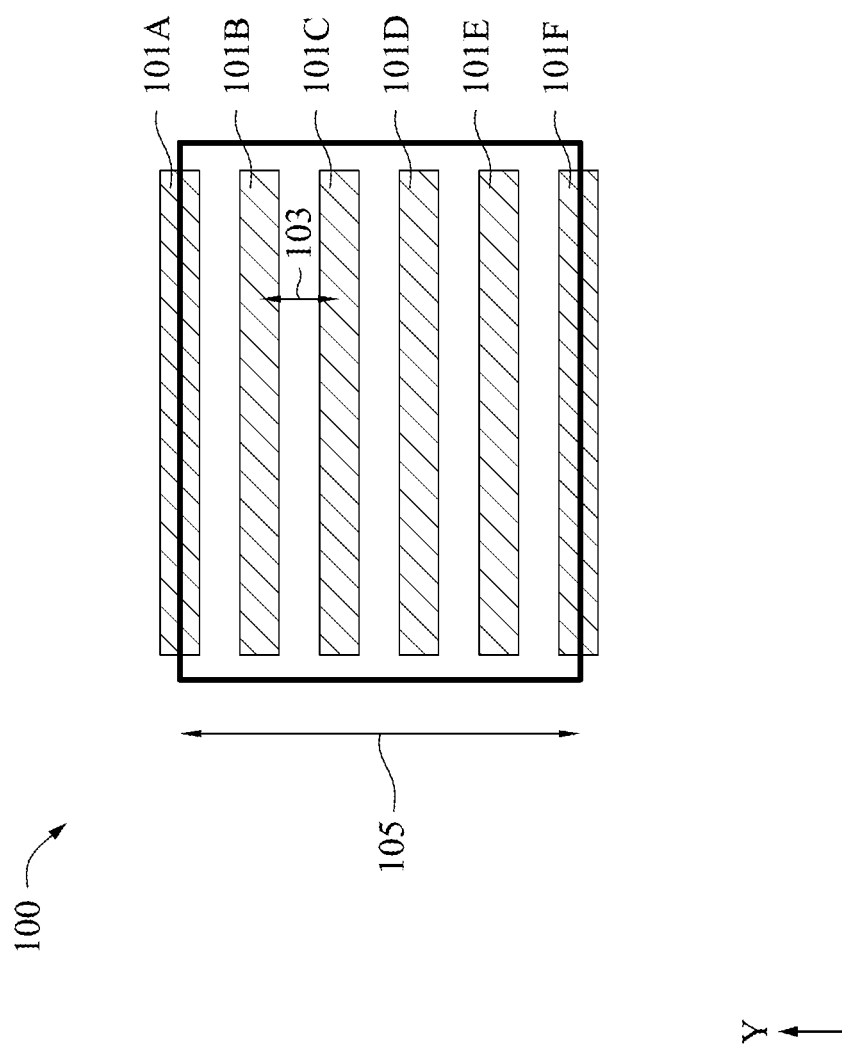
FIG. 1 illustrates an example layout design of an integrated circuit, in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device cell may include transistors with metal pattern structures (e.g., interconnection metal patterning, structures, layers, standard cells) above the transistors. The metal pattern structures include metal routing resource tracks (e.g., tracks, routes, tracts, lines, planes), e.g. for interconnecting polysilicon structures, as well as power metal tracks for providing power to the cell components. A cell may have multiple pattern structures. For example, a first metal pattern structure may indicate first metal tracks to be formed over cell transistors, and a second metal pattern structure may indicate second metal tracks to be formed over the first metal tracks. A transistor polysilicon structure extends transverse (e.g., transverse, perpendicular) to the resource tracks of a first metal pattern structure and a second metal pattern structure. Those resource tracks may be parallel to each other, or perpendicular to each other in distinct parallel planes.

As transistor density increases, it is desired that metal pattern structures are scaled to provide sufficient power and signal routes, or resource routes, to the increased number of transistors in a given space. However, due to process costs and limitations associated with mass production, electromigration rules, and other technical issues, the metal pitch of the metal pattern structures does not scale with the underlying transistor size. Thus, the metal pattern structures must have a reduced number of metal tracks within a given cell height. Accordingly, as the cell height decreases (e.g., to 120 nm) to accommodate an advanced node (e.g., N2 node), the metal pitch of the metal pattern structures fails to provide enough routing resources (e.g., between transistors). (It is understood that an N2 node refers to a node in which the transistors have an (e.g., minimum) effective gate lengths no greater than 2 nanometers.) Thus, minimum cell area (and chip area) cannot be achieved due to the metal pattern structure limitations.

The present disclosure provides exemplary circuits and methods, in accordance with layout designs without design rule violations, for providing sufficient routing resources while accommodating a shorter cell height. In some embodiments, the layout designs indicate a location of less than five M2 tracks within the cell height, while simultaneously indicating a location of one column of three M1 track segments perpendicular to the M2 tracks and within twice the cell height. In some embodiments, the integrated circuits are formed from the layout designs using one mask per metal layer without an additional mask for cutting the metal layer.

FIG. 1 illustrates an example layout design 100 of an integrated circuit, in accordance with embodiments of the present disclosure. The example layout design 100 includes layout patterns 101A-F. The layout design 100 may be a standard cell (e.g., unit region), and multiples (e.g., replicates) of the layout design 100 can be placed and routed such that different areas of an integrated circuit can have identical or similar configurations. The layout patterns 101A-F indicate a location of a set of metal tracks in a layer (e.g., M2 layer) over a substrate.

The layout patterns 101A-F may extend in the X-direction within an area of the standard cell. Each of the layout patterns 101A-F may have a width in the Y-direction. Each pair of adjacent layout patterns of 101A-F may have a pitch in the Y-direction. In one aspect, a pitch between two metal tracks is a distance between a half width point of one of the two metal tracks and a half width point of the other of the two metal tracks. For example, the layout patterns 101B and 101C are separated along the Y-direction according to a pitch 103.

In some embodiments, each of the layout patterns 101A and 101F can couple (e.g., connect, supply, carry) a ground or power (e.g., supply voltage, VSS or VDD) and each of the layout patterns 101B-E can couple a signal (e.g., a signal other than a ground or supply signal). The layout patterns 101B-E may have a first width and the layout patterns 101A and 101F may have a second width. In some embodiments, the first width and the second width are different. In other embodiments, they are the same. Adjacent pairs of layout patterns in which both layout patterns include that of 101B-E may have a first pitch (e.g., a first M2 pitch) and adjacent pairs of layout patterns in which one of the layout patterns includes 101A or 101F may have a second pitch (e.g., a second M2 pitch). In some embodiments, the first M2 pitch and the second M2 pitch are different. In other embodiments, they are the same.

The layout design 100 can include less than or greater than four layout patterns indicating an M2 metal track to couple a signal (M2 signal metal tracks). The layout design 100 can include less than or greater than two layout patterns indicating an M2 metal track to couple a power or ground (M2 power/ground metal tracks). The layout design 100 can include less than or greater than six layout patterns indicating M2 metal tracks.

The standard cell of the layout design 100 has a cell height 105 along the Y-direction. In some embodiments, the cell height is 120 nm or less. In some embodiments in which the cell height is 120 nm or less, the number of layout patterns indicating M2 signal metal tracks is 4 or less. In some embodiments in which the cell height is 120 nm or less. In some embodiments, the first M2 pitch is 20 nm or less. In embodiments where the first M2 pitch is equal to the second M2 pitch, the number of layout patterns indicating M2 signal metal tracks in the standard cell can be determined as the cell height divided by first M2 pitch minus the number of layout patterns indicating M2 power/ground metal tracks in the standard cell. In some embodiments, the cell height is from a half width point of a first power/ground metal track (e.g., 101A) and a half width point of a second power/ground metal track (e.g., 101F).

Figure 2:
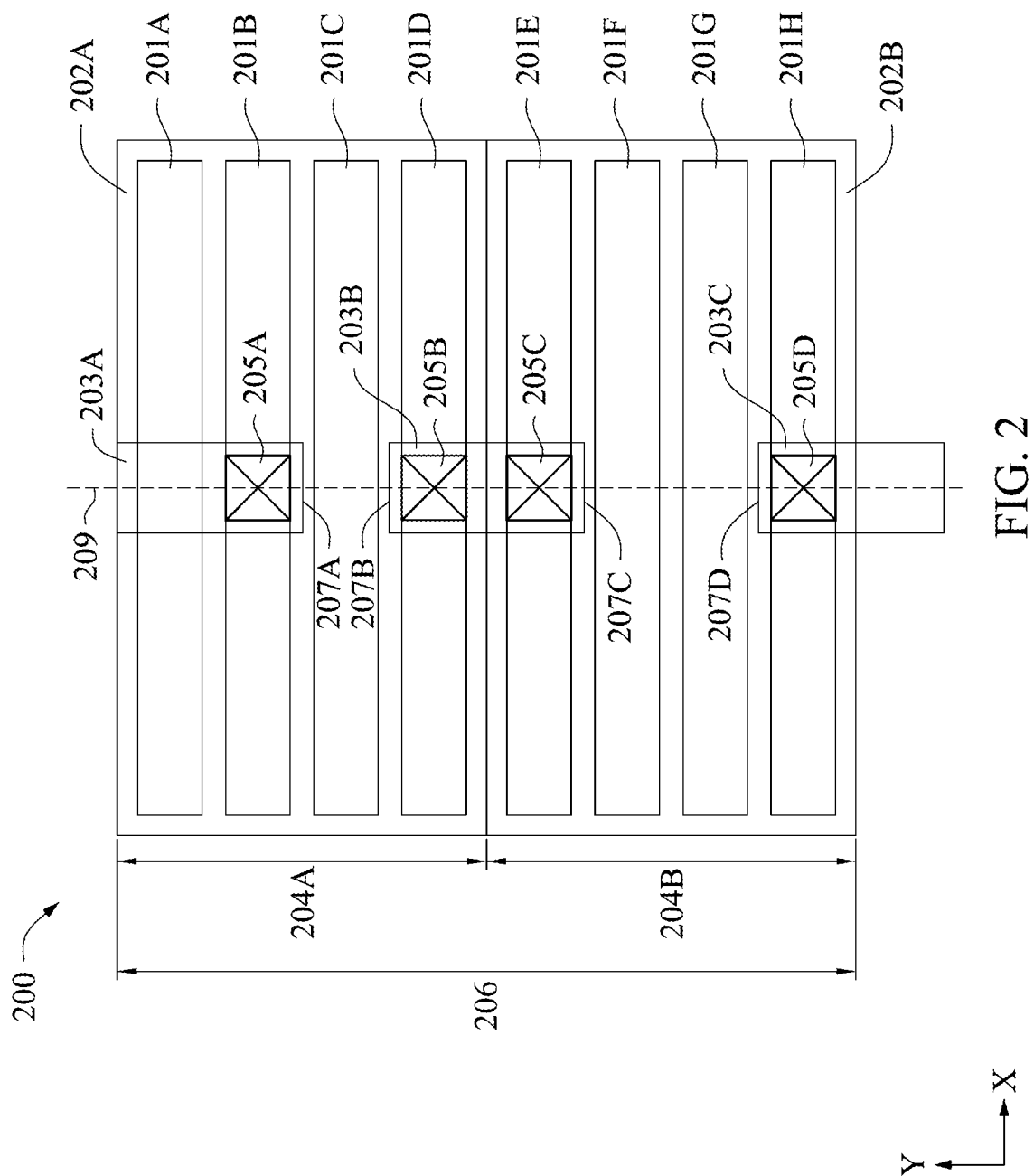
FIG. 2 illustrates an example layout design of an integrated circuit, in accordance with embodiments of the present disclosure.

FIG. 2 illustrates an example layout design 200 of an integrated circuit, in accordance with embodiments of the present disclosure. The layout design 200 has a first unit region 202A (e.g., a first portion, a first standard cell) that has a first cell height 204A. The layout design 200 has a second unit region 202B (e.g., a second portion, a second standard cell) that has a second cell height 204B. The layout design 200 has a double cell height 206 that is the sum of the cell height 204A and the cell height 204B.

The layout design 200 includes a first layout pattern indicating metal tracks in a first layer (e.g., M0 layer) over a substrate. The first layout pattern includes layout patterns 201A-H indicating a location of metal tracks for supplying one or more signals and layout patterns. The layout patterns 201A-H are within the double cell height 206. The layout patterns 201A-201D are within or the cell height 204A. The layout patterns 201E-201H are within cell height 204B.

In some embodiments, 201B, 201C, 201F, and 201G are for supplying one or more signals and 201A, 201D, 201E, and 201H are for supplying one or more powers or grounds. The layout patterns 201A-H extend in a first direction (e.g., X-direction) and are adjacent to each other (e.g., 201A is adjacent to 201B, 201B is adjacent to 201C, 201C is adjacent to 201D, 201D is adjacent to 201E, 201E is adjacent to 201F, 201F is adjacent to 201G, and 201G is adjacent to 201H) in a second direction (e.g., the Y-direction).

The layout design 200 includes a second layout pattern indicating a location of a set of metal track segments 203A-C in a second layer (e.g., M1 layer) over the first layer and farther from the substrate than the first layer. The metal track segments 203A-C extend in the second direction. The metal track segment 203A has an edge 207A extending in the first direction. The metal track segment 203B has an edge 207B facing the first edge 207A and an edge 207C opposite the edge 207B. The metal segment 203C has an edge 207D facing the edge 207C. In other words, the second metal track segment shifted in (e.g., only) the second direction from the first metal track segment, and the third metal track segment shifted (e.g., only) in the second direction from the first and second metal track segments. Thus, the metal track segments 203A-C align with each other in the first direction (e.g., their mid-width points 209 are aligned, they form a column in the second direction separated by spaces in between and around each segment). In some embodiments, the metal track segments 203A-203C are entirely within the double cell height. In some embodiments, at least a portion of each of the metal track segments 203A-203C are within the double cell height.

The layout design 200 includes a third layout pattern indicating a location of a set of via contacts 205A-D in a third layer disposed between the first layer and the second layer. In some embodiments, the first layout pattern, the second layout pattern, and the third layout pattern constitute various M0 to M1 pin access patterns. Each of the via contacts 205A-D formed according to the third layout pattern couples one of the metal tracks in the first layer formed according to one of the layout patterns 201A-H to one of the metal track segments in the second layer formed according to one of the second layout patterns 203A-C. For example, 205A is disposed between 201B and 203A, 205B is disposed between 201D and 203B, 205C is disposed between 201E and 203B, and 205D is disposed between 201H and 203C.

Figure 3A:
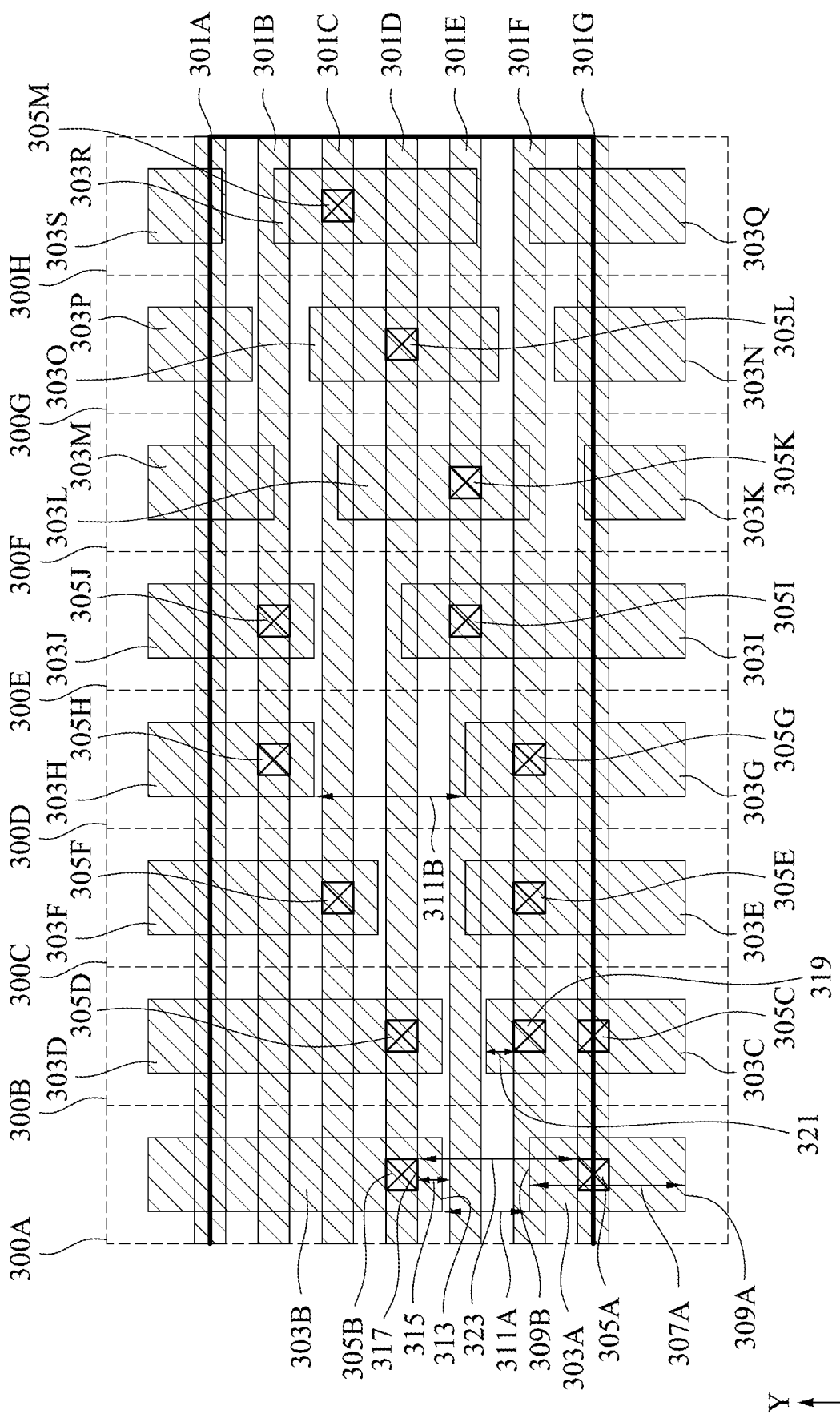
FIG. 3A illustrates multiple layout designs, in accordance with some embodiments of the present disclosure.

FIG. 3A illustrates multiple layout designs 300A-H, in accordance with some embodiments of the present disclosure. Each of the multiple layout designs 300A-H include a first layout pattern indicating metal tracks in a first layer (e.g., M0 layer) over a substrate. The first layout pattern includes layout patterns 301B-F indicating a location of five signal metal tracks for supplying one or more signals and layout patterns 301A and 301G indicating a location of two power/ground metal tracks for supplying one or more powers or grounds.

The layout patterns 301A-G extend in the X-direction and are adjacent to each other in the Y-direction (e.g., 301A is adjacent to 301B, 301B is adjacent to 301C, 301C is adjacent to 301D, 301D is adjacent to 301E, 301E is adjacent to 301F, 301F is adjacent to 301G).

The layout patterns 301B-F have a first width and the layout patterns 301A and 301G have a second width. In some embodiments, the first width and the second width are different. In other embodiments, they are the same. Adjacent pairs of layout patterns in which both layout patterns include that of 301B-F may have a first pitch (e.g., a first M0 pitch) and adjacent pairs of layout patterns in which one of the layout patterns includes 301A or 301G may have a second pitch (e.g., a second M0 pitch). In some embodiments, the first M0 pitch and the second M0 pitch are different. In other embodiments, they are the same. In some embodiments, the first M0 pitch is less than or equal to 20 nm. In some embodiments, the first M0 pitch is same as the first M2 pitch.

Each of the multiple layout designs 300A-H includes a second layout pattern indicating a location of a set of metal track segments in a second layer (e.g., M1 layer) over the first layer and farther from the substrate than the first layer. The second layout patterns extend in the Y-direction and align with each other in the X-direction (e.g., their mid width points are aligned). Thus, the second layout patterns extend in a direction that traverses (e.g., is perpendicular to) the first layout patterns.

The metal track segments in the second layer formed according to the second layout patterns of the multiple layout designs 300A-H may be formed using a first process, such as at least one of a nature end process, 1P1E (one-pattern, one-etch) nature end process, or a LSLE (litho-spacer-litho-etch) nature end process. In some embodiments, nature end process is a process that uses one mask per metal layer without an additional mask for cutting the metal layer. In some embodiments, metal track segments formed using the first process can be formed in accordance with a first via enclosure, end-to-end (E2E) spacing, and minimum length for the metal tracks in the second layer.

Each of the multiple layout designs 300A-H includes a third layout pattern indicating a location of a set of via contacts (e.g., via0) in a third layer disposed between the first layer and the second layer. In some embodiments, the first layout pattern, the second layout pattern, and the third layout pattern constitute various M0 to M1 pin access patterns. Each of the via contacts formed according to the third layout pattern couples one of the metal tracks in the first layer formed according to one of the layout patterns 301A-G to one of the metal track segments in the second layer formed according to one of the second layout patterns.

The second layout pattern of the layout design 300A includes layout patterns 303A-B. The metal track segment of the layout pattern 303A (e.g., the metal track segment formed according to the layout pattern 303A) is formed over (e.g., overlapping, overlapping in the X-Y plane, formed at least partially over) the metal tracks of the layout patterns 301F-G. The metal track segment of the layout pattern 303B is formed over metal tracks of the layout patterns 301A-D. The third layout pattern of the layout design 300A includes the layout patterns 305A-B. The via contact of the layout pattern 305A (e.g., the via contact formed according to the layout pattern 305A) couples the metal track of the layout pattern 301G to the track segment of the layout pattern 303A. The via contact of the layout pattern 305B couples the metal track of the layout pattern 301D to the metal track segment of the layout pattern 303B.

Each rectangular layout pattern has four edges (e.g., sides, ends) including two short edges and two long edges. In some embodiments, the two short edges are smaller in length than the two long edges. The layout pattern 303A has a minimum length 307A in the Y-direction (e.g., a distance from a short edge 309A to a short edge 309B). The layout pattern 303A and 303B have an E2E spacing 311A in the Y-direction (e.g., a distance between the short edge 309B of the layout pattern 303A and a short edge 313 of the layout pattern 303B facing the short edge 309B in the Y-direction). The layout pattern 305B has a via enclosure 315 in the Y-direction (e.g., a distance between the short edge 313 of the layout pattern 303B and the edge 317 of the layout pattern 305B facing the short edge 313 in the Y-direction). The layout patterns 305A and 305B have a distance 323 in between them. In some embodiments, the distance 323 is a sum of the E2E spacing 311A, the via enclosure 315, and a second via enclosure associated with the short edge 309B and the layout pattern 305A.

The second layout pattern of the layout design 300B includes layout patterns 303C-D (which are analogous to the layout patterns 303A-B of the layout design 300A, respectively). The third layout pattern of the layout design 300B includes the layout patterns 305C-D (which are analogous to the second layout patterns 305A-B of the layout design 300A, respectively). The layout design 300B also includes a fourth layout pattern indicating a location of one or more via contacts (e.g., via1) formed over the second layer and farther from the substrate than the second layer. The fourth layout pattern of the layout design 300B includes the layout pattern 319. A via contact of the layout pattern 319 (e.g., the via contact formed according to the layout pattern 319) is coupled to the metal track segment of the layout pattern 303C. The via contact of the layout pattern 319 is formed over the metal track of the layout pattern 301F. The layout pattern 319 has a via enclosure 321.

The second layout pattern of the layout design 300C includes layout patterns 303E-F. The metal track segment of the layout pattern 303E is formed over the metal tracks of the layout patterns 301E-G. The metal track segment of the layout pattern 303F is formed over the metal tracks of the layout patterns 301A-C. The third layout pattern of the layout design 300C includes the layout patterns 305E-F. The via contact of the layout pattern 305E couples the metal track of the layout pattern 301F to the metal track segment of the layout pattern 303E. The via contact of the layout pattern 305F couples the metal track of the layout pattern 301C to the metal track segment of the layout pattern 303F.

The second layout pattern of the layout design 300D includes layout patterns 303G-H. The metal track segment of the layout pattern 303G is formed over the metal tracks of the layout patterns 301E-G. The metal track segment of the layout pattern 303H is formed over the metal tracks of the layout patterns 301A-B. The third layout pattern of the layout design 300D includes the layout patterns 305G-H. The via contact of the layout pattern 305G couples the metal track of the layout pattern 301F to the metal track segment of the layout pattern 303G. The via contact of the layout pattern 305H couples the metal track of the layout pattern 301B to the metal track segment of the layout pattern 303H. Thus, for example, the E2E 311B between the layout patterns 303G and 303H is less than 3 times the first M0 pitch (neither 303G nor 303H is formed over M0 metal tracks 301C or 301D).

The second layout pattern of the layout design 300E includes layout patterns 303I-J. The metal track segment of the layout pattern 303I is formed over the metal tracks of the layout patterns 301D-G. The metal track segment of the layout pattern 303J is formed over the metal tracks of the layout patterns 301A-B. The third layout pattern of the layout design 300E includes the layout patterns 305I-J. The via contact of the layout pattern 305I couples the metal track of the layout pattern 301E to the metal track segment of the layout pattern 303I. The via contact of the layout pattern 305J couples the metal track of the layout pattern 301B to the metal track segment of the layout pattern 303J.

The second layout pattern of the layout design 300F includes layout patterns 303K-M. The metal track segment of the layout pattern 303K is formed over the metal track of the layout pattern 301G. The metal track segment of the layout pattern 303L is formed over the metal tracks of the layout patterns 301C-F. The metal track segment of the layout pattern 303M is formed over the metal track of the layout patterns 301A-B. The third layout pattern of the layout design 300F includes the layout pattern 305K. The via contact of the layout pattern 305K couples the metal track of the layout pattern 301E to the metal track segment of the layout pattern 303L.

The second layout pattern of the layout design 300G includes layout patterns 303N-P. The metal track segment of the layout pattern 303N is formed over the metal track of the layout pattern 301G. The metal track segment of the layout pattern 303O is formed over the metal tracks of the layout patterns 301C-E. The metal track segment of the layout pattern 303P is formed over the metal track of the layout pattern 301A. The third layout pattern of the layout design 300G includes the layout pattern 305L. The via contact of the layout pattern 305L couples the metal track of the layout pattern 301D to the metal track segment of the layout pattern 303O.

The second layout pattern of the layout design 300H includes layout patterns 303Q-S. The metal track segment of the layout pattern 303Q is formed over the metal tracks of the layout patterns 301F-G. The metal track segment of the layout pattern 303R is formed over the metal tracks of the layout patterns 301B-E. The metal track segment of the layout pattern 303S is formed over the metal track of the layout pattern 301A. The third layout pattern of the layout design 300H includes the layout pattern 305M. The via contact of the layout pattern 305M couples the metal track of the layout pattern 301C to the metal track segment of the layout pattern 303R.

Figure 3B:
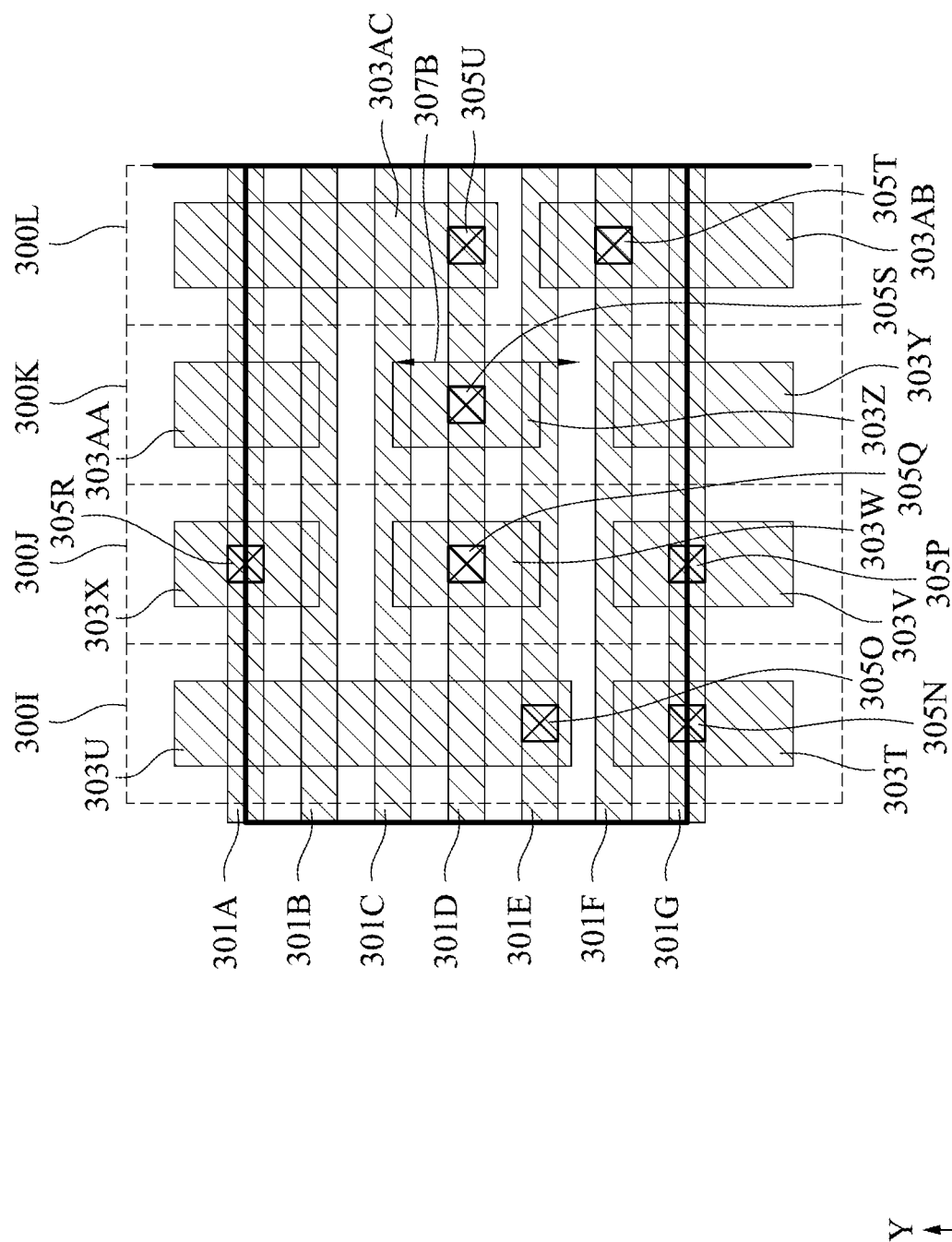
FIG. 3B illustrates multiple layout designs, in accordance with some embodiments of the present disclosure.

FIG. 3B illustrates multiple layout designs 300I-L, in accordance with some embodiments of the present disclosure. The multiple layout designs 300I-L are similar to the multiple layout designs 300A-H. The metal tracks in the second layer formed according to the second layout patterns of the multiple layout designs 300I-L may be formed using a second process (e.g., a nature end process, 1P1E nature end process, LSLE nature end process). In some embodiments, the metal tracks formed using the second process can be formed in accordance with a second via enclosure, end-to-end (E2E) spacing, and minimum length for the metal tracks in the second layer. The second via enclosure, end-to-end (E2E) spacing, and minimum length is smaller (e.g., smaller, shorter, narrower, tighter) than the first via enclosure, end-to-end (E2E) spacing, and minimum length.

The second layout pattern of the layout design 300I includes layout patterns 303T-U. The metal track segment of the layout pattern 303T is formed over the metal track of the layout patterns 301F-G. The metal track segment of the layout pattern 303U is formed over the metal tracks of the layout patterns 301A-E. The third layout pattern of the layout design 300I includes the layout patterns 305N-O. The via contact of the layout pattern 305N couples the metal track of the layout pattern 301G to the metal track segment of the layout pattern 303T. The via contact of the layout pattern 305O couples the metal track of the layout pattern 301E to the metal track segment of the layout pattern 303U.

The second layout pattern of the layout design 300J includes layout patterns 303V-X. The metal track segment of the layout pattern 303V is formed over the metal track of the layout patterns 301F-G. The metal track segment of the layout pattern 303W is formed over the metal tracks of the layout patterns 301C-E. The metal track segment of the layout pattern 303X is formed over the metal tracks of the layout patterns 301A-B. The third layout pattern of the layout design 300J includes the layout patterns 305P-R. The via contact of the layout pattern 305P couples the metal track of the layout pattern 301G to the metal track segment of the layout pattern 303V. The via contact of the layout pattern 305Q couples the metal track of the layout pattern 301D to the metal track segment of the layout pattern 303W. The via contact of the layout pattern 305R couples the metal track of the layout pattern 301A to the metal track segment of the layout pattern 303X.

The second layout pattern of the layout design 300K includes layout patterns 303Y-AA. The metal track segment of the layout pattern 303Y is formed over the metal track of the layout patterns 301F-G. The metal track segment of the layout pattern 303Z is formed over the metal tracks of the layout patterns 301C-E. The metal track segment of the layout pattern 303AA is formed over the metal tracks of the layout patterns 301A-B. The layout pattern 303Z has a minimum length 307B. The third layout pattern of the layout design 300K includes the layout pattern 305S. The via contact of the layout pattern 305S couples the metal track of the layout pattern 301D to the metal track segment of the layout pattern 303Z.

The second layout pattern of the layout design 300L includes layout patterns 303AB-AC. The metal track segment of the layout pattern 303AB is formed over the metal track of the layout patterns 301E-G. The metal track segment of the layout pattern 303AC is formed over the metal tracks of the layout patterns 301A-D. The third layout pattern of the layout design 300L includes the layout patterns 305T-U. The via contact of the layout pattern 305T couples the metal track of the layout pattern 301F to the metal track segment of the layout pattern 303AB. The via contact of the layout pattern 305U couples the metal track of the layout pattern 301D to the metal track segment of the layout pattern 303AC.

Figure 4A:
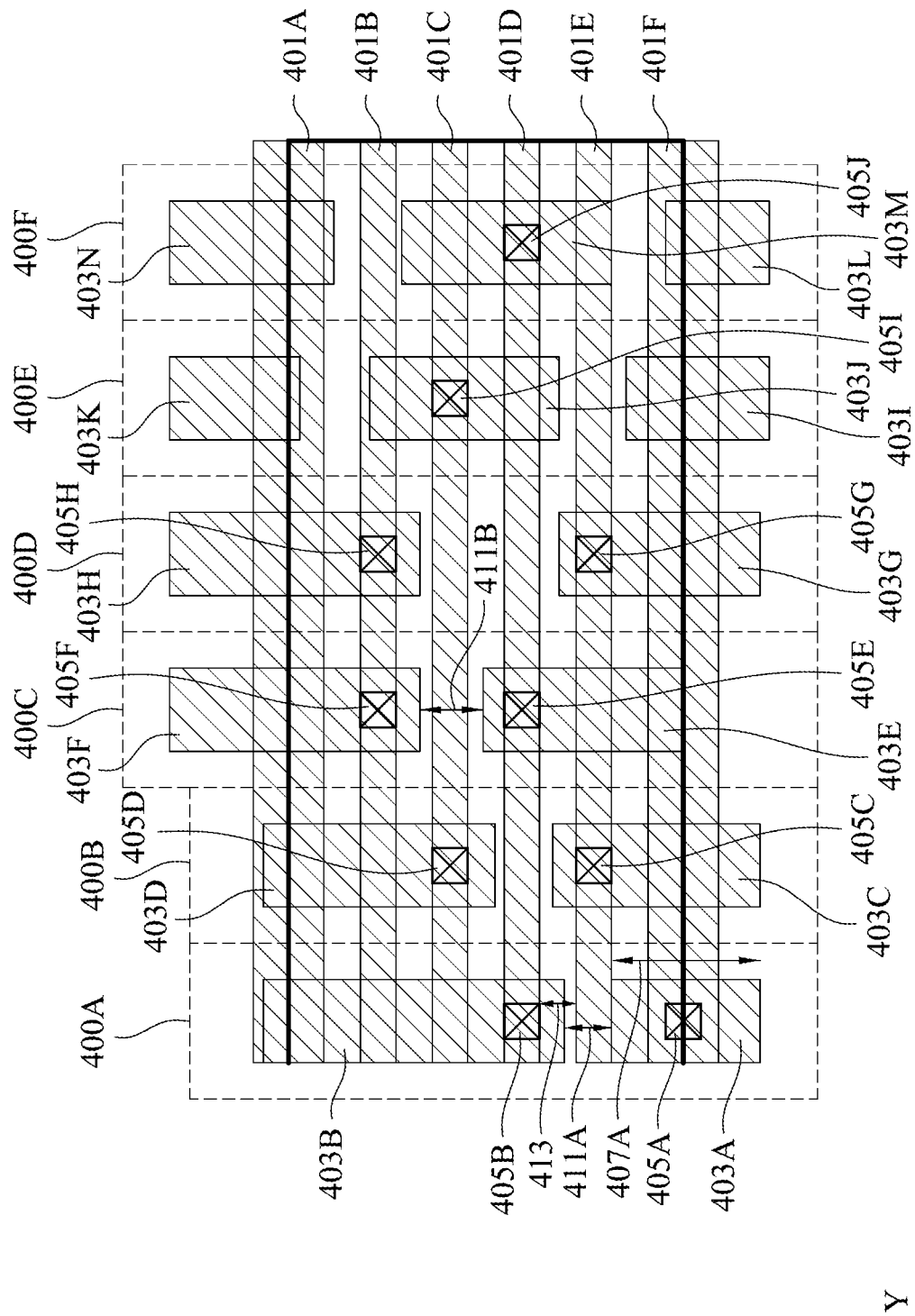
FIG. 4A illustrates multiple layout designs, in accordance with some embodiments of the present disclosure.

FIG. 4A illustrates multiple layout designs 400A-F, in accordance with some embodiments of the present disclosure. The first layout pattern of the layout designs 400A-F includes layout patterns 401B-E indicating a location of four signal metal tracks for supplying one or more signals and layout patterns 401A and 401F indicating a location of two power/ground metal tracks for supplying one or more powers or grounds in a first layer.

The layout patterns 401A-F extend in the X-direction and are adjacent to each other in the Y-direction (e.g., 401A is adjacent to 401B, 401B is adjacent to 401C, 401C is adjacent to 401D, 401D is adjacent to 401E, 401E is adjacent to 401F).

A first width and a first pitch associated with the layout patterns 401B-E are similar to the first width and the first pitch, respectively, associated with the layout patterns 301B-F. In some embodiments, a second width and a second pitch associated with the layout patterns 401A and 401F are similar to the second width and the second pitch, respectively, associated with the layout patterns 301A and 301G. In other embodiments, the second width and the second pitch associated with the layout patterns 401A and 401F are bigger (e.g., bigger, wider, longer, etc.) or smaller (e.g., smaller, narrower, shorter, etc.) than the second width and the second pitch, respectively, associated with the layout patterns 301A and 301G.

The second layout pattern of the layout designs 400A-F indicates metal tracks extending in the Y-direction in the second layer farther from the substrate than the first layer. The metal tracks in the second layer formed according to the second layout patterns of the multiple layout designs 400A-F may be formed using the first process. The third layout pattern of the layout designs 400A-F indicates via contacts in the third layer disposed between the first layer and the second layer. The fourth layout pattern of the layout designs 400A-F indicates via contacts in the fourth layer farther from the substrate than the second layer.

The second layout pattern of the layout design 400A includes layout patterns 403A-B. The metal track segment of the layout pattern 403A is formed over the metal tracks of the layout patterns 401E-F. The metal track segment of the layout pattern 403B is formed over the metal tracks of the layout patterns 401A-D. The third layout pattern of the layout design 400A includes the layout patterns 405A-B. The via contact of the layout pattern 405A couples the metal track of the layout pattern 401F to the metal track segment of the layout pattern 403A. The via contact of the layout pattern 405B couples the metal track of the layout pattern 401D to the metal track segment of the layout pattern 403B.

The layout pattern 403A has a minimum length 407A in the Y-direction. The layout pattern 403A and 403B have an E2E spacing 411A in the Y-direction. The layout pattern 405B has a via enclosure 415 in the Y-direction.

The second layout pattern of the layout design 400B includes layout patterns 403C-D. The metal track segment of the layout pattern 403C is formed over the metal tracks of the layout patterns 401E-F. The metal track segment of the layout pattern 403D is formed over the metal tracks of the layout patterns 401A-C. The third layout pattern of the layout design 400B includes the layout patterns 405C-D. The via contact of the layout pattern 405C couples the metal track of the layout pattern 401E to the metal track segment of the layout pattern 403C. The via contact of the layout pattern 405D couples the metal track of the layout pattern 401C to the metal track segment of the layout pattern 403D.

The second layout pattern of the layout design 400C includes layout patterns 403E-F. The metal track segment of the layout pattern 403E is formed over the metal tracks of the layout patterns 401D-F. The metal track segment of the layout pattern 403F is formed over the metal tracks of the layout patterns 401A-B. The third layout pattern of the layout design 400C includes the layout patterns 405E-F. The via contact of the layout pattern 405E couples the metal track of the layout pattern 401D to the metal track segment of the layout pattern 403E. The via contact of the layout pattern 405F couples the metal track of the layout pattern 401B to the metal track segment of the layout pattern 403F.

The second layout pattern of the layout design 400D includes layout patterns 403G-H. The metal track segment of the layout pattern 403G is formed over the metal tracks of the layout patterns 401E-F. The metal track segment of the layout pattern 403H is formed over the metal tracks of the layout patterns 401A-B. The third layout pattern of the layout design 400D includes the layout patterns 405G-H. The via contact of the layout pattern 405G couples the metal track of the layout pattern 401E to the metal track segment of the layout pattern 403G. The via contact of the layout pattern 405H couples the metal track of the layout pattern 401B to the metal track segment of the layout pattern 403H.

The second layout pattern of the layout design 400E includes layout patterns 403I-K. The metal track segment of the layout pattern 403I is formed over the metal track of the layout pattern 401F. The metal track segment of the layout pattern 403J is formed over the metal tracks of the layout patterns 401B-D. The metal track segment of the layout pattern 403K is formed over the metal track of the layout pattern 401A. The third layout pattern of the layout design 400E includes the layout pattern 405I. The via contact of the layout pattern 405I couples the metal track of the layout pattern 401C to the metal track segment of the layout pattern 403J.

The second layout pattern of the layout design 400F includes layout patterns 403L-M. The metal track segment of the layout pattern 403L is formed over the metal track of the layout pattern 401F. The metal track segment of the layout pattern 403M is formed over the metal tracks of the layout patterns 401C-E. The metal track segment of the layout pattern 403N is formed over the metal track of the layout pattern 401A. The third layout pattern of the layout design 400F includes the layout pattern 405J. The via contact of the layout pattern 405J couples the metal track of the layout pattern 401D to the metal track segment of the layout pattern 403M.

Figure 4B:
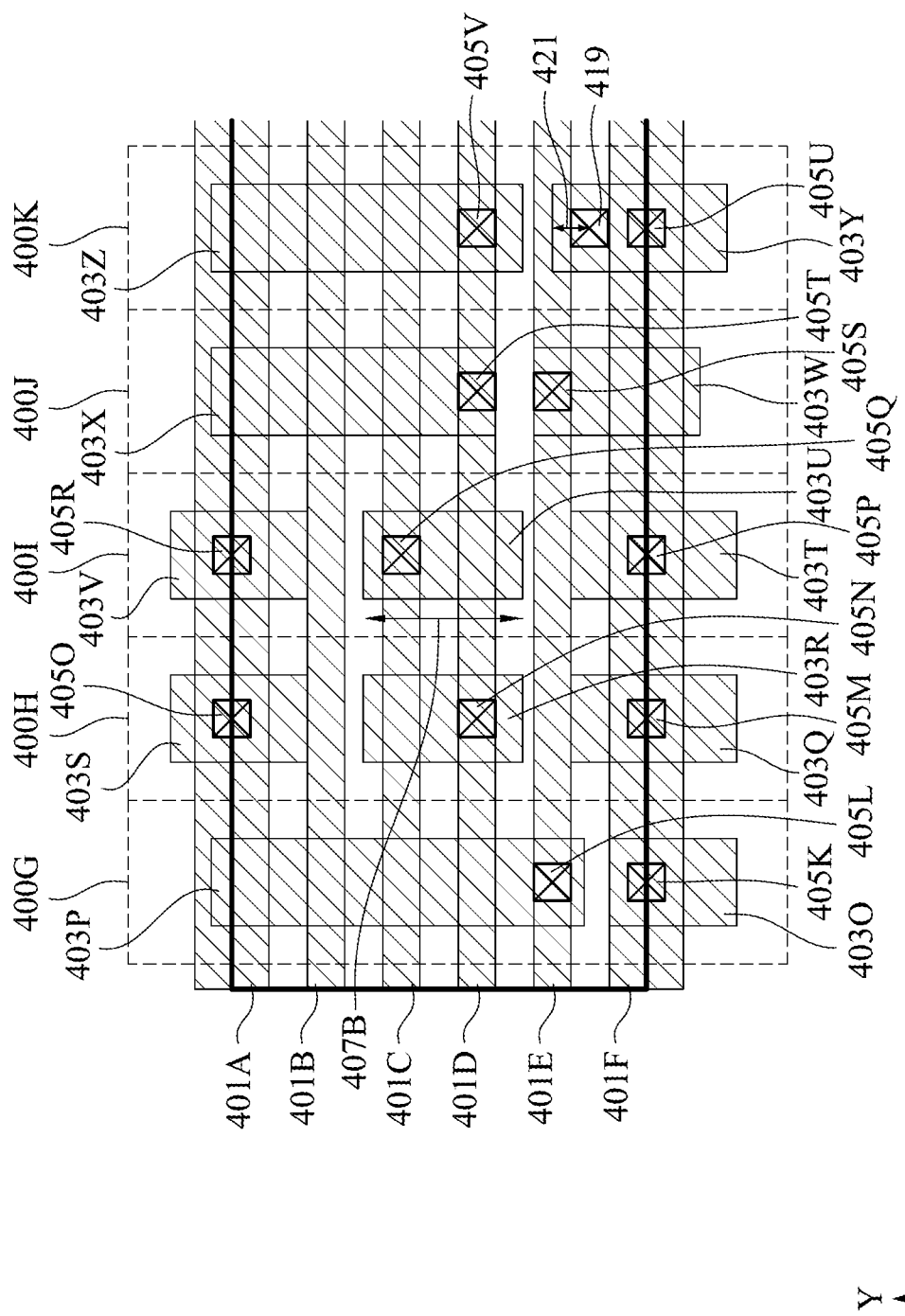
FIG. 4B illustrates multiple layout designs, in accordance with some embodiments of the present disclosure.

FIG. 4B illustrates multiple layout designs 400G-K, in accordance with some embodiments of the present disclosure. The multiple layout designs 400G-K are similar to the multiple layout designs 400A-F. The metal tracks in the second layer formed according to the second layout patterns of the multiple layout designs 400G-K may be formed using the second process.

The second layout pattern of the layout design 400G includes layout patterns 403O-P. The metal track segment of the layout pattern 403O is formed over the metal track of the layout pattern 401F. The metal track segment of the layout pattern 403P is formed over the metal tracks of the layout patterns 401A-E. The third layout pattern of the layout design 400G includes the layout patterns 405K-L. The via contact of the layout pattern 405K couples the metal track of the layout pattern 401F to the metal track segment of the layout pattern 403O. The via contact of the layout pattern 405L couples the metal track of the layout pattern 401E to the metal track segment of the layout pattern 403P.

The second layout pattern of the layout design 400H includes layout patterns 403Q-S. The metal track segment of the layout pattern 403Q is formed over the metal track of the layout pattern 401F. The metal track segment of the layout pattern 403R is formed over the metal tracks of the layout patterns 401C-D. The metal track segment of the layout pattern 403S is formed over the metal track of the layout pattern 401A. The third layout pattern of the layout design 400H includes the layout patterns 405M-O. The via contact of the layout pattern 405M couples the metal track of the layout pattern 401F to the metal track segment of the layout pattern 403Q. The via contact of the layout pattern 405N couples the metal track of the layout pattern 401D to the metal track segment of the layout pattern 403R. The via contact of the layout pattern 405O couples the metal track of the layout pattern 401A to the metal track segment of the layout pattern 403S.

The second layout pattern of the layout design 400I includes layout patterns 403T-V. The metal track segment of the layout pattern 403T is formed over the metal track of the layout pattern 401F. The metal track segment of the layout pattern 403U is formed over the metal tracks of the layout patterns 401C-D. The metal track segment of the layout pattern 403V is formed over the metal track of the layout pattern 401A. The layout pattern 403U has a minimum length 407B. The third layout pattern of the layout design 400I includes the layout patterns 405P-R. The via contact of the layout pattern 405P couples the metal track of the layout pattern 401F to the metal track segment of the layout pattern 403T. The via contact of the layout pattern 405Q couples the metal track of the layout pattern 401C to the metal track segment of the layout pattern 403U. The via contact of the layout pattern 405R couples the metal track of the layout pattern 401A to the metal track segment of the layout pattern 403V.

The second layout pattern of the layout design 400J includes layout patterns 403W-X. The metal track segment of the layout pattern 403W is formed over the metal tracks of the layout patterns 401E-F. The metal track segment of the layout pattern 403X is formed over the metal tracks of the layout patterns 401A-D. The third layout pattern of the layout design 400J includes the layout patterns 405S-T. The via contact of the layout pattern 405S couples the metal track of the layout pattern 401E to the metal track segment of the layout pattern 403W. The via contact of the layout pattern 405T couples the metal track of the layout pattern 401D to the metal track segment of the layout pattern 403X.

The second layout pattern of the layout design 400K includes layout patterns 403Y-Z. The metal track segment of the layout pattern 403Y is formed over the metal tracks of the layout patterns 401E-F. The metal track segment of the layout pattern 403Z is formed over the metal tracks of the layout patterns 401A-D. The third layout pattern of the layout design 400K includes the layout patterns 405U-V. The via contact of the layout pattern 405U couples the metal track of the layout pattern 401F to the metal track segment of the layout pattern 403Y. The via contact of the layout pattern 405V couples the metal track of the layout pattern 401D to the metal track segment of the layout pattern 403Z. The fourth layout pattern of the layout design 400K includes the layout pattern 419. The via contact of the layout pattern 419 is coupled to the layout pattern 405U. The layout pattern 419 has a via enclosure 421.

Figure 5A:
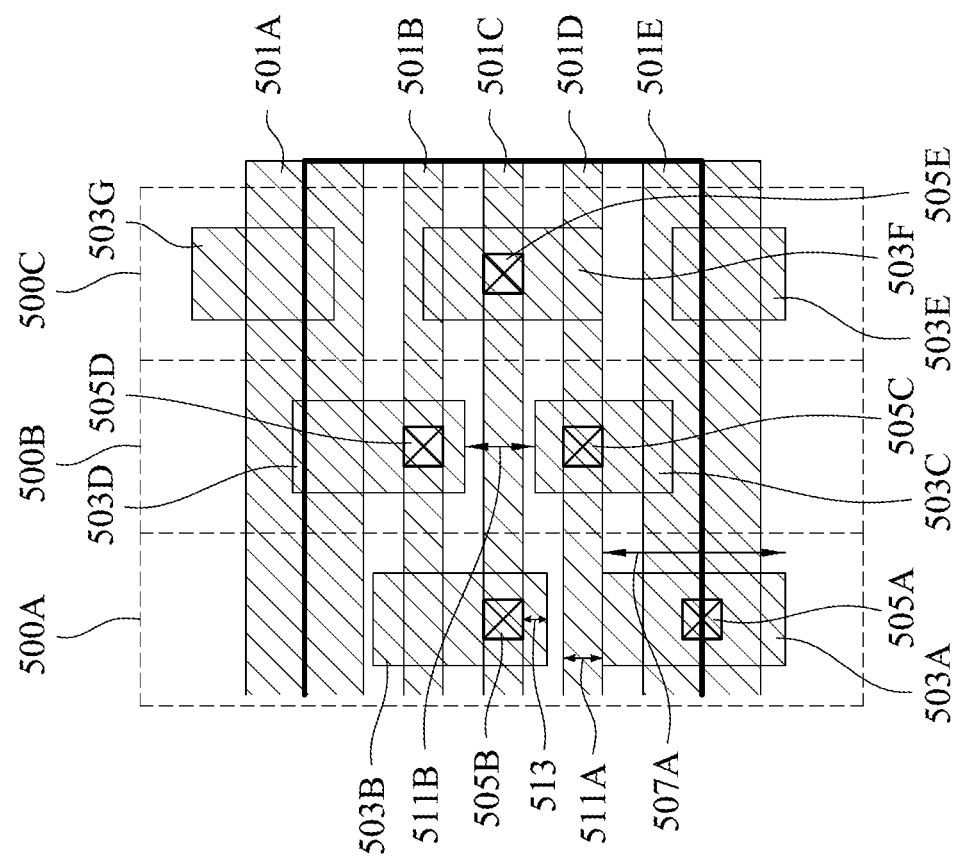
FIG. 5A illustrates multiple layout designs, in accordance with some embodiments of the present disclosure.

FIG. 5A illustrates multiple layout designs 500A-C, in accordance with some embodiments of the present disclosure. The first layout pattern of the layout designs 500A-C includes layout patterns 501B-D indicating a location of three signal metal tracks for supplying one or more signals and layout patterns 501A and 501E indicating a location of two power/ground metal tracks for supplying one or more powers or grounds in a first layer.

The layout patterns 501A-E extend in the X-direction and are adjacent to each other in the Y-direction (e.g., 501A is adjacent to 501B, 501B is adjacent to 501C, 501C is adjacent to 501D, and 501D is adjacent to 501E).

A first width and a first pitch associated with the layout patterns 501B-D are similar to the first width and the first pitch, respectively, associated with the layout patterns 301B-F. In some embodiments, a second width and a second pitch associated with the layout patterns 501A and 501F are similar to the second width and the second pitch, respectively, associated with the layout patterns 301A and 301G. In other embodiments, the second width and the second pitch associated with the layout patterns 501A and 501E are different from the second width and the second pitch, respectively, associated with the layout patterns 301A and 301G.

The second layout pattern of the layout designs 500A-C indicates metal tracks extending in the Y-direction in the second layer farther from the substrate than the first layer. The metal tracks in the second layer formed according to the second layout patterns of the multiple layout designs 500A-C may be formed using the first process. The third layout pattern of the layout designs 500A-C indicates via contacts in the third layer disposed between the first layer and the second layer. The fourth layout pattern of the layout designs 500A-C indicates via contacts in the fourth layer farther from the substrate than the second layer.

The second layout pattern of the layout design 500A includes layout patterns 503A-B. The metal track segment of the layout pattern 503A is formed over the metal track of the layout pattern 501E. The metal track segment of the layout pattern 503B is formed over the metal tracks of the layout patterns 501B-C. The third layout pattern of the layout design 500A includes the layout patterns 505A-B. The via contact of the layout pattern 505A couples the metal track of the layout pattern 501E to the metal track segment of the layout pattern 503A. The via contact of the layout pattern 505B couples the metal track of the layout pattern 501C to the metal track segment of the layout pattern 503B.

The layout pattern 503A has a minimum length 507A in the Y-direction. The layout pattern 503A and 503B have an E2E spacing 511A in the Y-direction. The layout pattern 505B has a via enclosure 515 in the Y-direction.

The second layout pattern of the layout design 500B includes layout patterns 503C-D. The metal track segment of the layout pattern 503C is formed over the metal tracks of the layout patterns 501D-E. The metal track segment of the layout pattern 503D is formed over the metal tracks of the layout patterns 501A-B. The third layout pattern of the layout design 500B includes the layout patterns 505C-D. The via contact of the layout pattern 505C couples the metal track of the layout pattern 501D to the metal track segment of the layout pattern 503C. The via contact of the layout pattern 505D couples the metal track of the layout pattern 501B to the metal track segment of the layout pattern 503D.

The second layout pattern of the layout design 500C includes layout patterns 503C-D. The metal track segment of the layout pattern 503E is formed over the metal track of the layout pattern 501E. The metal track segment of the layout pattern 503F is formed over the metal tracks of the layout patterns 501B-D. The metal track segment of the layout pattern 503G is formed over the metal track of the layout pattern 501A. The third layout pattern of the layout design 500C includes the layout pattern 505E. The via contact of the layout pattern 505E couples the metal track of the layout pattern 501C to the metal track segment of the layout pattern 503F.

Figure 5B:
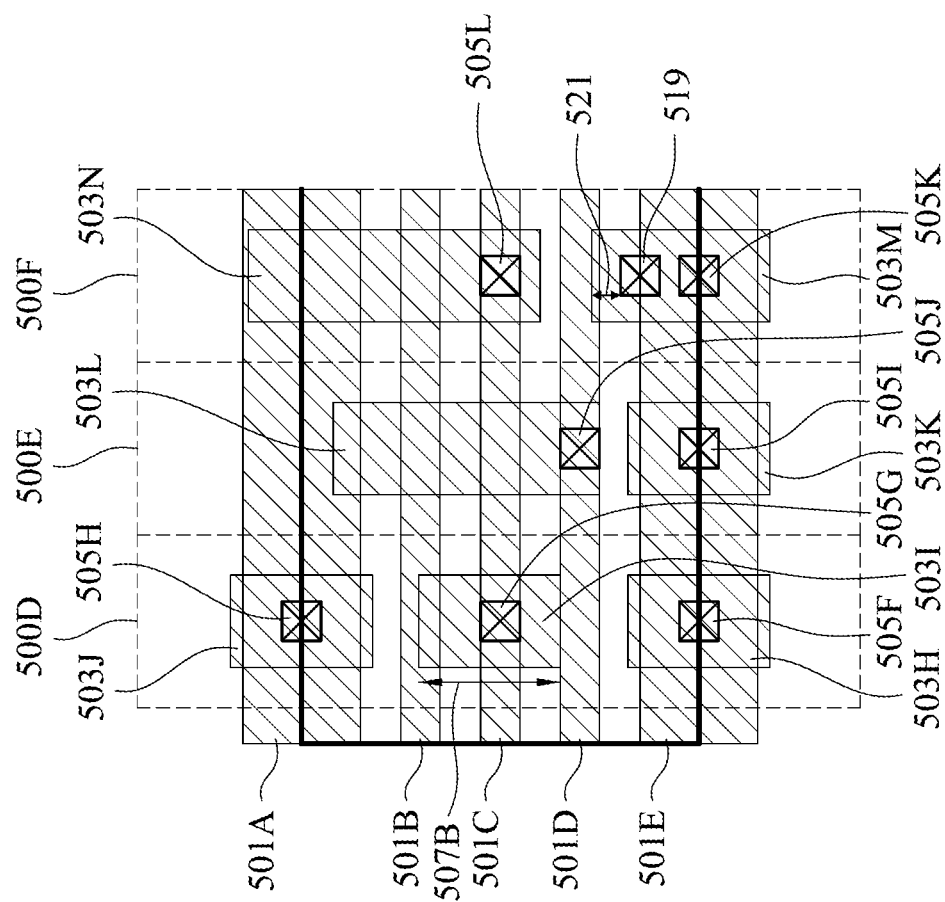
FIG. 5B illustrates multiple layout designs, in accordance with some embodiments of the present disclosure.

FIG. 5B illustrates multiple layout designs 500D-F, in accordance with some embodiments of the present disclosure. The multiple layout designs 500D-F are similar to the multiple layout designs 500A-C. The metal tracks in the second layer formed according to the second layout patterns of the multiple layout designs 500D-F may be formed using the second process.

The second layout pattern of the layout design 500D includes layout patterns 503H-J. The metal track segment of the layout pattern 503H is formed over the metal track of the layout pattern 501E. The metal track segment of the layout pattern 503I is formed over the metal tracks of the layout patterns 501B-C. The metal track segment of the layout pattern 503J is formed over the metal track of the layout pattern 501A. The third layout pattern of the layout design 500D includes the layout patterns 505F-H. The via contact of the layout pattern 505F couples the metal track of the layout pattern 501E to the metal track segment of the layout pattern 503H. The via contact of the layout pattern 505G couples the metal track of the layout pattern 501C to the metal track segment of the layout pattern 503I. The via contact of the layout pattern 505H couples the metal track of the layout pattern 501A to the metal track segment of the layout pattern 503J.

The second layout pattern of the layout design 500E includes layout patterns 503K-L. The metal track segment of the layout pattern 503K is formed over the metal track of the layout pattern 501E. The metal track segment of the layout pattern 503L is formed over the metal tracks of the layout patterns 501A-D. The third layout pattern of the layout design 500E includes the layout patterns 505I-J. The via contact of the layout pattern 505I couples the metal track of the layout pattern 501E to the metal track segment of the layout pattern 503K. The via contact of the layout pattern 505J couples the metal track of the layout pattern 501D to the metal track segment of the layout pattern 503L.

The second layout pattern of the layout design 500F includes layout patterns 503M-N. The metal track segment of the layout pattern 503M is formed over the metal tracks of the layout patterns 501D-E. The metal track segment of the layout pattern 503N is formed over the metal tracks of the layout patterns 501A-C. The third layout pattern of the layout design 500F includes the layout patterns 505K-L. The via contact of the layout pattern 505K couples the metal track of the layout pattern 501E to the metal track segment of the layout pattern 503M. The via contact of the layout pattern 505L couples the metal track of the layout pattern 501C to the metal track segment of the layout pattern 503N. The fourth layout pattern of the layout design 500F includes the layout pattern 519. The via contact of the layout pattern 519 is coupled to the layout pattern 503M. The layout pattern 519 has a via enclosure 521.

Figure 6A:
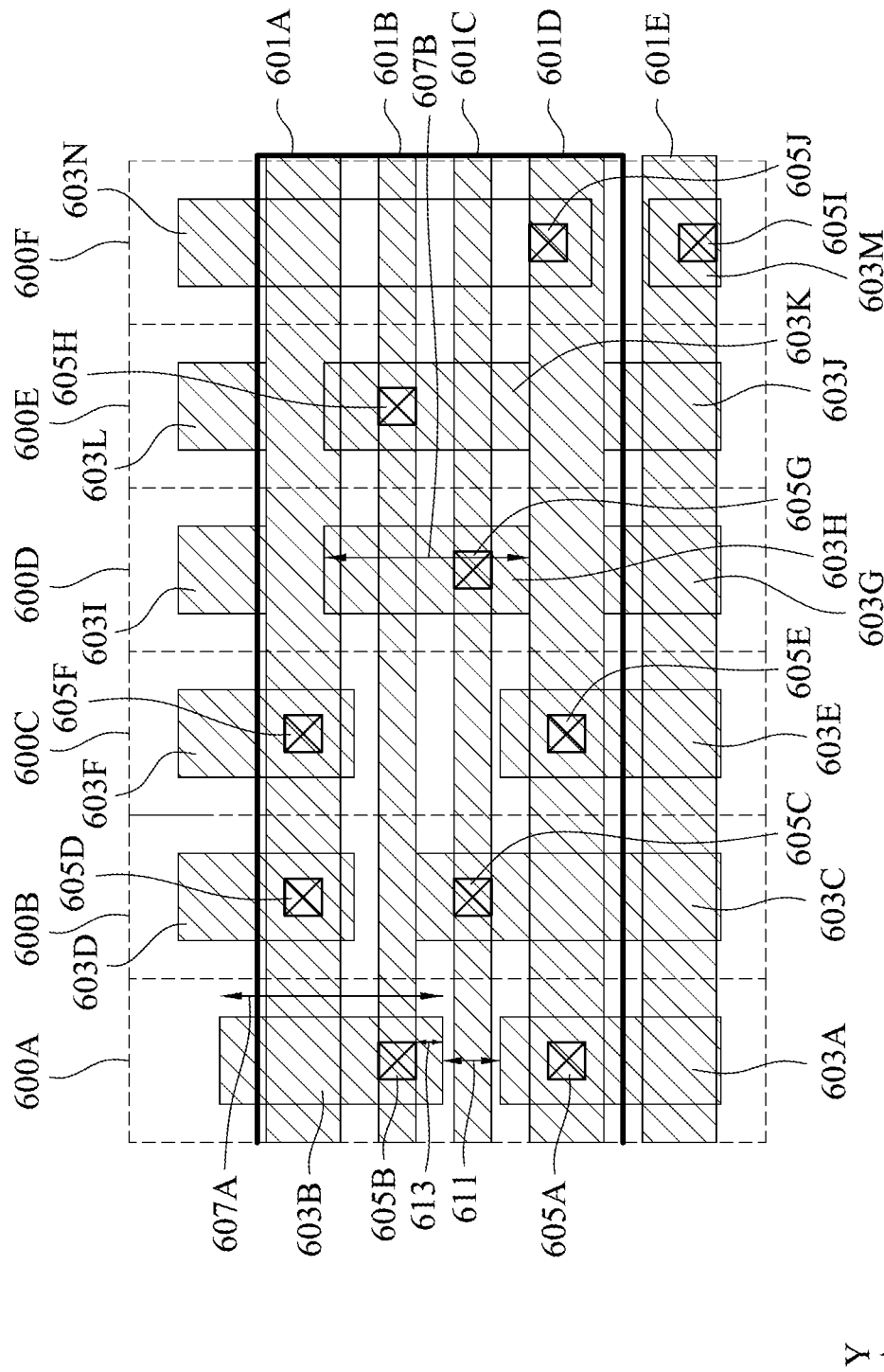
FIG. 6A illustrates multiple layout designs, in accordance with some embodiments of the present disclosure.

FIG. 6A illustrates multiple layout designs 600A-F, in accordance with some embodiments of the present disclosure. The first layout pattern of the layout designs 600A-F includes layout patterns 601A-D indicating a location of four signal metal tracks in a standard cell for supplying one or more signals in a first layer (e.g., M0) and layout pattern 601E indicating a location of a signal metal track in an adjacent standard cell for supplying a signal in the first layer. In some embodiments, the first layout pattern does not indicate a location of any power/ground metal tracks in the first layer.

The layout patterns 601A-E extend in the X-direction and are adjacent to each other in the Y-direction (e.g., 601A is adjacent to 601B, 601B is adjacent to 601C, 601C is adjacent to 601D, and 601D is adjacent to 601E). In some embodiments, the first width and a first pitch associated with the layout patterns 601A-E are similar to the first width and the first pitch, respectively, associated with the layout patterns 301B-F. In some embodiments, the first width and the first pitch associated with the layout patterns 601A-E are not a uniform width and pitch, respectively.

The second layout pattern of the layout designs 600A-F indicates metal tracks extending in the Y-direction in the second layer farther from the substrate than the first layer. The metal tracks in the second layer formed according to the second layout patterns of the multiple layout designs 600A-F may be formed using the first process. The third layout pattern of the layout designs 600A-F indicates via contacts in the third layer disposed between the first layer and the second layer.

The second layout pattern of the layout design 600A includes layout patterns 603A-B. The metal track segment of the layout pattern 603A is formed over the metal tracks of the layout patterns 601D-E. The metal track segment of the layout pattern 603B is formed over the metal tracks of the layout patterns 601A-B. The third layout pattern of the layout design 600A includes the layout patterns 605A-B. The via contact of the layout pattern 605A couples the metal track of the layout pattern 601D to the metal track segment of the layout pattern 603A. The via contact of the layout pattern 605B couples the metal track of the layout pattern 601B to the metal track segment of the layout pattern 603B.

The layout pattern 603A has a minimum length 607A in the Y-direction. The layout pattern 603A and 603B have an E2E spacing 611 in the Y-direction. The layout pattern 605B has a via enclosure 615 in the Y-direction.

The second layout pattern of the layout design 600B includes layout patterns 603C-D. The metal track segment of the layout pattern 603C is formed over the metal tracks of the layout patterns 601C-E. The metal track segment of the layout pattern 603D is formed over the metal track of the layout pattern 601A. The third layout pattern of the layout design 600B includes the layout patterns 605C-D. The via contact of the layout pattern 605C couples the metal track of the layout pattern 601C to the metal track segment of the layout pattern 603C. The via contact of the layout pattern 605D couples the metal track of the layout pattern 601A to the metal track segment of the layout pattern 603D.

The second layout pattern of the layout design 600C includes layout patterns 603E-F. The metal track segment of the layout pattern 603E is formed over the metal tracks of the layout patterns 601D-E. The metal track segment of the layout pattern 603F is formed over the metal track of the layout pattern 601A. The third layout pattern of the layout design 600C includes the layout patterns 605E-F. The via contact of the layout pattern 605E couples the metal track of the layout pattern 601D to the metal track segment of the layout pattern 603E. The via contact of the layout pattern 605F couples the metal track of the layout pattern 601A to the metal track segment of the layout pattern 603F.

The second layout pattern of the layout design 600D includes layout patterns 603G-I. The metal track segment of the layout pattern 603G is formed over the metal track of the layout pattern 601E. The metal track segment of the layout pattern 603H is formed over the metal tracks of the layout patterns 601A-C. The metal track segment of the layout pattern 603I is formed such that it is abutted with the metal track of the layout pattern 601A in the X-Y plane. The layout pattern 603H has a minimum length 607B. The third layout pattern of the layout design 600D includes the layout patterns 605G. The via contact of the layout pattern 605G couples the metal track of the layout pattern 601C to the metal track segment of the layout pattern 603H.

The second layout pattern of the layout design 600E includes layout patterns 603J-L. The metal track segment of the layout pattern 603J is formed over the metal track of the layout pattern 601E. The metal track segment of the layout pattern 603K is formed over the metal tracks of the layout patterns 601A-C. The metal track segment of the layout pattern 603L is formed such that it is abutted with the metal track of the layout pattern 601A in the X-Y plane. The third layout pattern of the layout design 600E includes the layout patterns 605H. The via contact of the layout pattern 605H couples the metal track of the layout pattern 601B to the metal track segment of the layout pattern 603K.

The second layout pattern of the layout design 600F includes layout patterns 603M-N. The metal track segment of the layout pattern 603M is formed over the metal track of the layout pattern 601E. The metal track segment of the layout pattern 603N is formed over the metal tracks of the layout patterns 601A-D. The third layout pattern of the layout design 600F includes the layout patterns 605I-J. The via contact of the layout pattern 605I couples the metal track of the layout pattern 601E to the metal track segment of the layout pattern 603M. The via contact of the layout pattern 605J couples the metal track of the layout pattern 601D to the metal track segment of the layout pattern 603N.

Figure 6B:
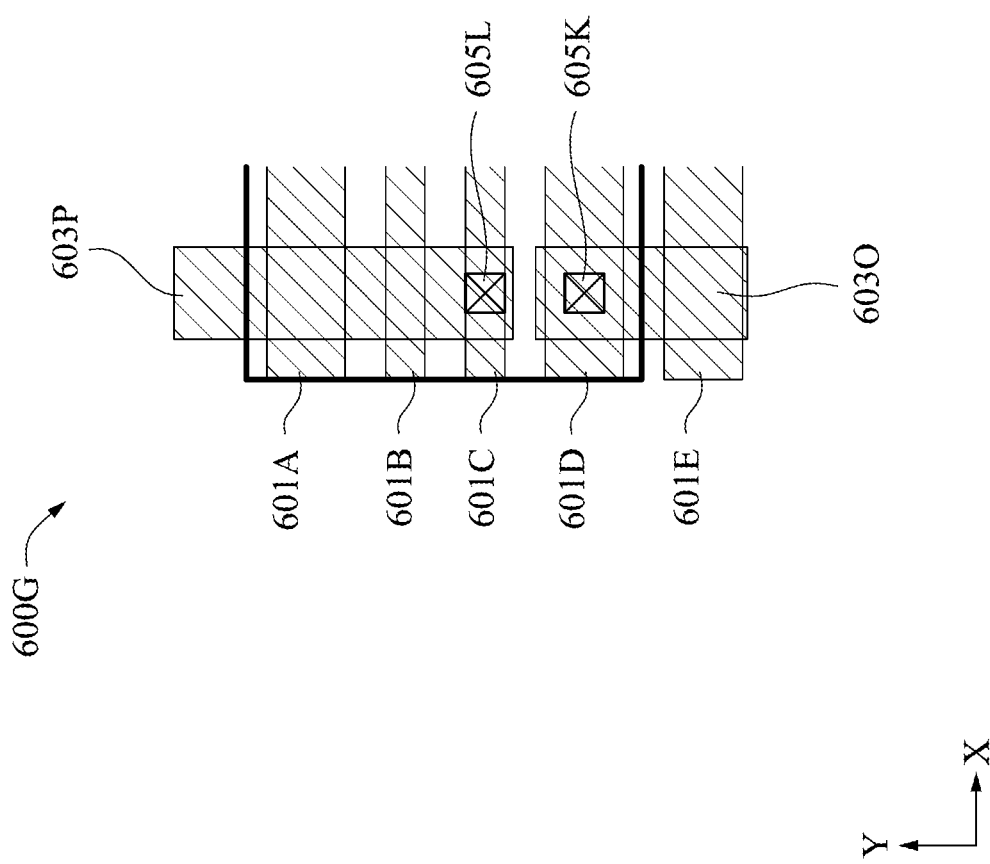
FIG. 6B illustrates multiple layout designs, in accordance with some embodiments of the present disclosure.

FIG. 6B illustrates multiple layout design 600G, in accordance with some embodiments of the present disclosure. The multiple layout design 600G is similar to the multiple layout designs 600A-F. The metal tracks in the second layer formed according to the second layout patterns of the multiple layout design 600G may be formed using the second process.

The second layout pattern of the layout design 600G includes layout patterns 603O-P. The metal track segment of the layout pattern 603O is formed over the metal tracks of the layout patterns 601D-E. The metal track segment of the layout pattern 603P is formed over the metal tracks of the layout patterns 601A-C. The third layout pattern of the layout design 600G includes the layout patterns 605K-L. The via contact of the layout pattern 605K couples the metal track of the layout pattern 601D to the metal track segment of the layout pattern 603O. The via contact of the layout pattern 605L couples the metal track of the layout pattern 601C to the metal track segment of the layout pattern 603P.

Figure 7A:
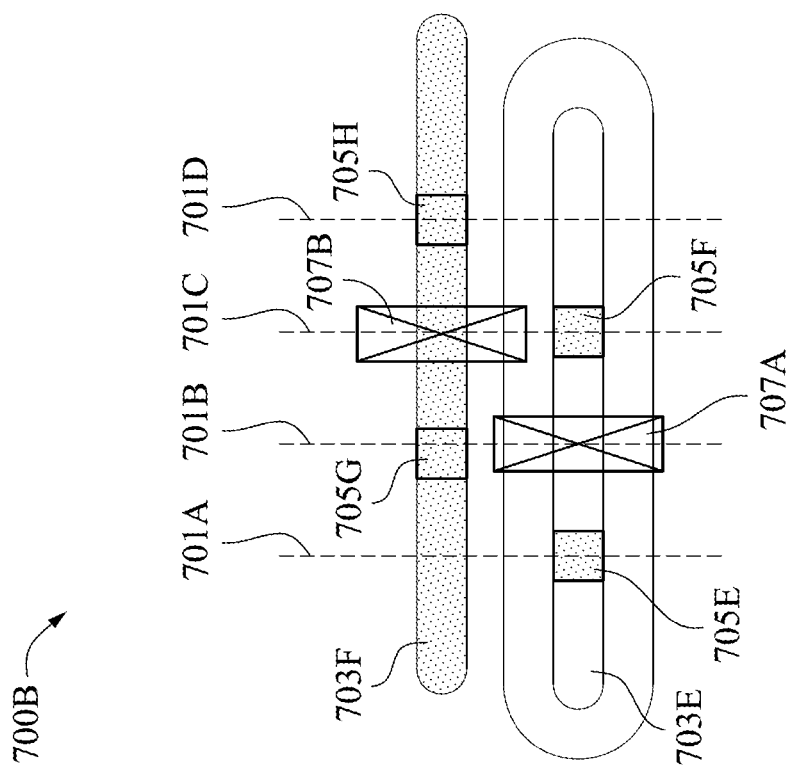
FIG. 7A illustrates a layout design, in accordance with some embodiments of the present disclosure.

FIG. 7A illustrates a layout design 700A, in accordance with some embodiments of the present disclosure. The layout design 700A includes layout patterns 701A-E that indicate a location of metal tracks, in an M1 layer above the substrate, extending in a Y-direction and adjacent to each other in the X-direction. The layout patterns 701A-E have an M1 pitch 702. The layout design 700A includes M2 metal patterns 703A-D that indicate a location of M2 metal tracks, in a M2 layer farther from the substrate than the M1 layer, extending in a X-direction, 703A and 703B aligned with each other in the Y-direction, 703C and 703D aligned with each other in the Y-direction, 703A adjacent to 703C in the Y-direction, and 703B adjacent to 703D in the Y-direction.

The layout design 700A includes via contact patterns 705A-D that indicate a location of via contacts, in a via2 layer in between the M1 layer and the M2 layer. The via contact of the layout pattern 705A couples the M2 metal track of the layout pattern 703A to the M1 metal track of the layout pattern 701A. The via contact of the layout pattern 705B couples the M2 metal track of the layout pattern 703B to the M1 metal track of the layout pattern 701D. The via contact of the layout pattern 705C couples the M2 metal track of the layout pattern 703C to the M1 metal track of the layout pattern 701A. The via contact of the layout pattern 705D couples the M2 metal track of the layout pattern 703D to the M1 metal track of the layout pattern 701D.

The M2 metal tracks of the layout design 700A are formed using a nature end process. In some embodiments, the distance between the via contacts 705A and 705B is 3 times the M1 pitch. In some embodiments, the distance between the via contacts 705C and 705D is 3 times the M1 pitch.

Figure 7B:
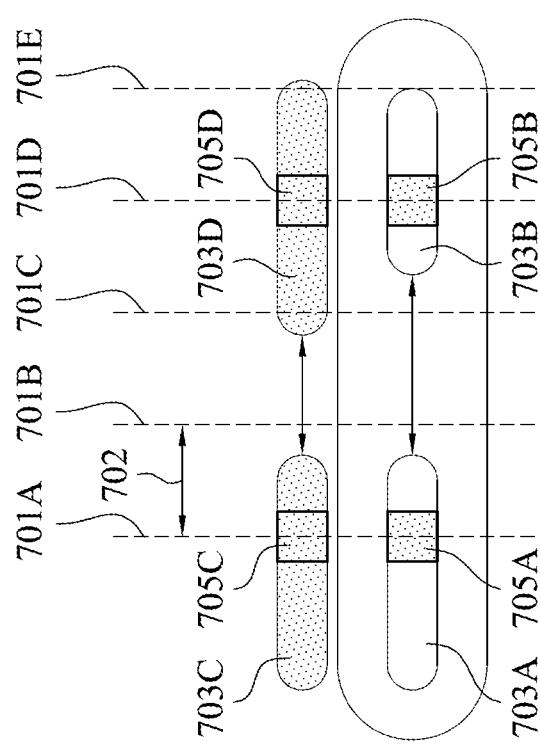
FIG. 7B illustrates a layout design, in accordance with some embodiments of the present disclosure.

FIG. 7B illustrates a layout design 700B, in accordance with some embodiments of the present disclosure. The layout design 700B includes the M1 metal patterns 701A-D. The layout design 700B includes M2 metal patterns 703E-F that indicate a location of M2 metal tracks, in a M2 layer farther from the substrate than the M1 layer, extending in a X-direction, 703E adjacent to 703F in the Y-direction.

The layout design 700B includes via contact patterns 705E-H that indicate a location of via contacts, in a via2 layer in between the M1 layer and the M2 layer. The via contact of the layout pattern 705E couples the M2 metal track of the layout pattern 703E to the M1 metal track of the layout pattern 701A. The via contact of the layout pattern 705F couples the M2 metal track of the layout pattern 703E to the M1 metal track of the layout pattern 701C. The via contact of the layout pattern 705G couples the M2 metal track of the layout pattern 703F to the M1 metal track of the layout pattern 701B. The via contact of the layout pattern 705H couples the M2 metal track of the layout pattern 703F to the M1 metal track of the layout pattern 701D. Thus, the via contacts of the layout patterns 705E-F are laid out in a staggered manner in relation to the via contacts of the layout patterns 705G-H.

The M2 metal tracks of the layout design 700B are formed using a cut process. The cuts are 707A-B. In some embodiments, the distance between the via contacts 705E and 705F is 2 times the M1 pitch. In some embodiments, the distance between the via contacts 705G and 705H is 2 times the M1 pitch.

Figure 8:
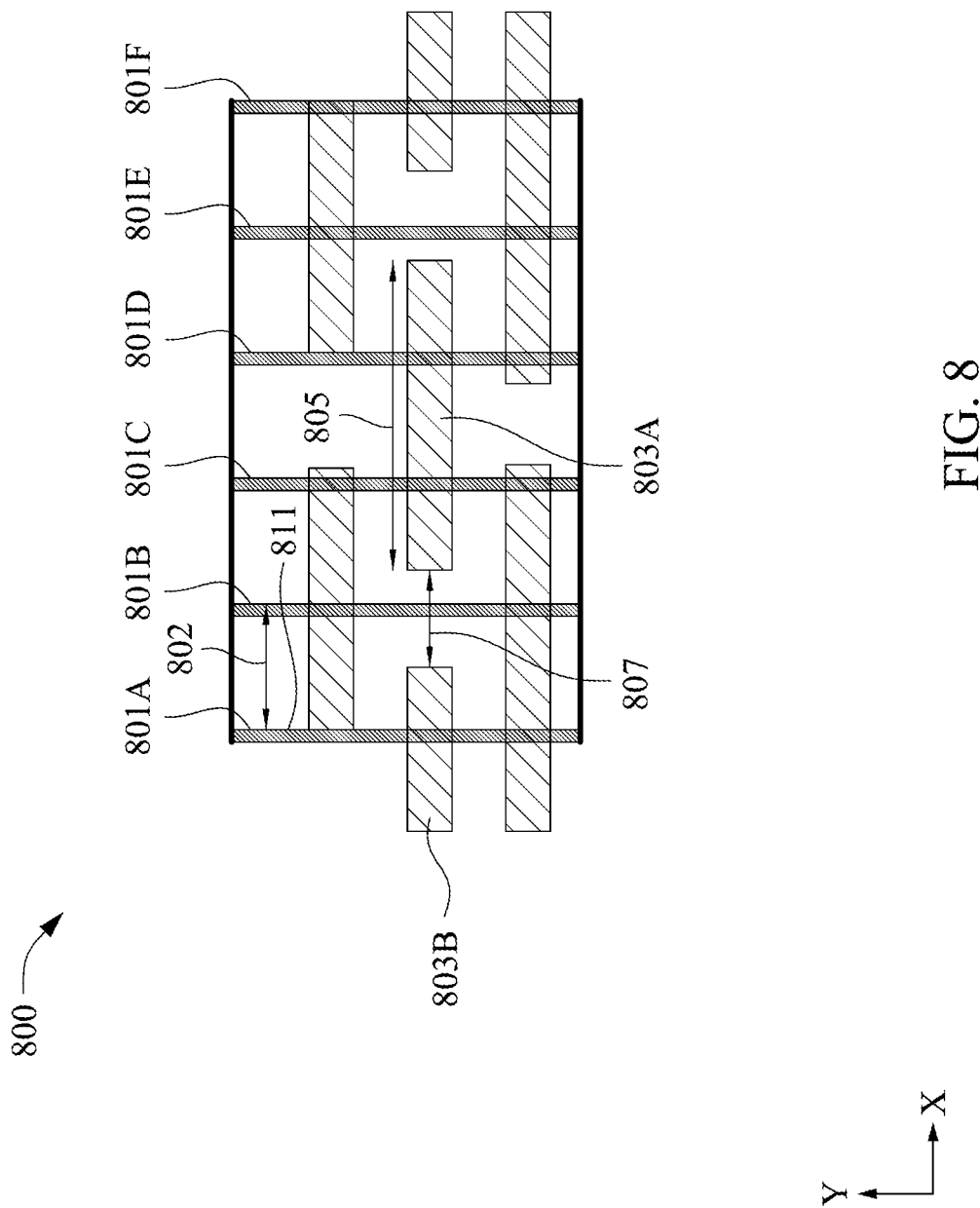
FIG. 8 illustrates a layout design, in accordance with some embodiments of the present disclosure.

FIG. 8 illustrates a layout design 800, in accordance with some embodiments of the present disclosure. The layout design 800 includes poly patterns 801A-E that indicate a location of poly tracks, in a poly layer above a substrate, extending in a Y-direction and adjacent to each other in the X-direction. The poly patterns have a poly pitch 802. The layout design 700A includes M2 metal patterns 803A-B that indicate a location of M2 metal tracks, in a M2 layer farther from the substrate than the poly layer, extending in a X-direction. The layout patterns 803A and 803B are aligned with each other in the Y-direction. The layout pattern 803A has a minimum length 805. The layout patterns 803A and the 803B have an E2E spacing 807.

Figure 9:
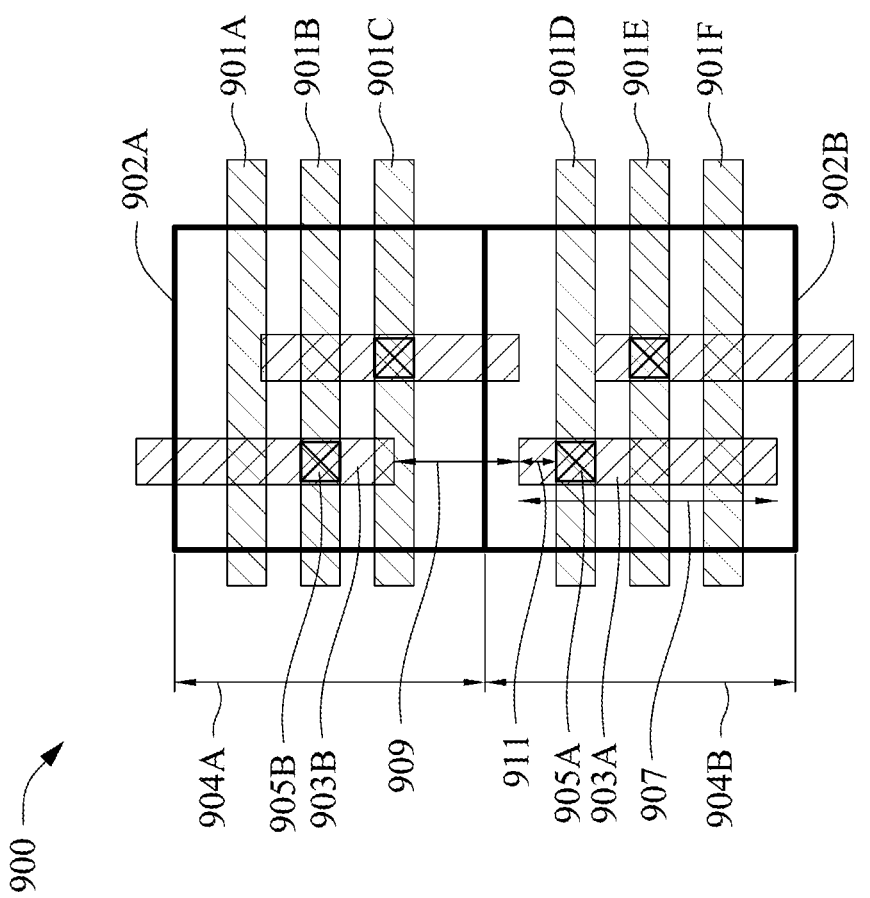
FIG. 9 illustrates a layout design, in accordance with some embodiments of the present disclosure.

FIG. 9 illustrates a layout design 900, in accordance with some embodiments of the present disclosure. The layout design 900 includes M2 metal patterns 901A-F that indicate a location of M2 metal tracks, in an M2 layer above a substrate, extending in an X-direction and adjacent to each other in the Y-direction. The M2 metal patterns 901A-C indicate a set of M2 metal tracks, for supplying a signal, within a first standard cell 902A. The M2 metal patterns 901D-F indicate a set of M2 metal tracks, for supplying a signal, within a second standard cell 902B. In some embodiments, the standard cells include M2 metal patterns indicating a set of M2 metal tracks for supplying a power/ground.

The standard cell 902A has a cell height 904A. The standard cell 902B has a cell height 904B.

The layout design 900 includes M3 metal patterns 903A-B indicating a location of M3 metal tracks, in an M3 layer farther above the substrate than the M2 layer, extending in a Y-direction and aligned with each other in the X-direction. The M3 metal pattern 903A has a minimum length 907 that is less than the cell height 904B. The M3 metal pattern 903A and the M3 metal pattern 903B have an E2E spacing 909.

The layout design 900 includes via contact patterns 905A-B. The via contact of the layout pattern 905A couples the M2 metal track of the layout pattern 901D to the M3 metal track of the layout pattern 903A. The via contact of the layout pattern 905B couples the M2 metal track of the layout pattern 901B to the M3 metal track of the layout pattern 903B. The layout pattern 905A has a via enclosure 911.

In some embodiments, the M2 layer of at least one of the layout designs 700A-B, 800, or 900 is similar to the M2 layer of the layout design 100. In some embodiments, the first layer, the second layer, the third layer, and the fourth layer of at least one of the layout designs 300A-L, 400A-K, 500A-F, and 600A-G is disposed between the poly layer and the M2 layer of at least one of the layout designs 700A-B, 800, or 900. In one aspect, an integrated circuit can be fabricated or formed according to one or more of the layout designs 100, 300A-L, 400A-K, 500A-F, 600A-G, 700A-B, 800, or 900.

Various techniques have been created to implement double or multiple patterning. One technique is a LSLE technique. In a LSLE technique, a pattern is divided into two parts that are implemented sequentially during the IC device manufacturing process using two patterning steps with each patterning step followed by a corresponding etch (removal) process. The removal process is performed to remove portions of the underlying material layer, e.g., a metal layer (M0–MX), interlayer dielectric (ILD), and/or other materials in order to achieve the desired device topography.

In some embodiments, the LSLE technique is replaced by a pattern-etch (1P1E) process that, as a consequence of the reduced number of processing steps, will improve utilization of the fab production resources and/or improve the yield of the IC devices being manufactured.

Multiple patterning (or multi-patterning) processes encompass a group of techniques and methods that have been developed to allow for the imaging of ever smaller metal patterns used for increasing feature density in a layout beyond what is achievable during the manufacture of integrated circuits using a single mask. Double patterning is a technology developed for lithography to enhance feature density in integrated circuits, but each additional mask utilized in the production of an IC device increases the cost of manufacturing, reduces the production capacity of the fab, and/or increases the likelihood of introducing one or more defects. In some embodiments, smaller feature sizes have been formed using extreme ultraviolet (EUV) exposure wavelengths for lithography processes and the corresponding use of EUV patterns and masks. By reducing the number of patterning operations in the production flow for manufacturing an IC device, the techniques and methods disclosed herein improves contact access, simplifies the design process, simplifies the manufacturing process, improves manufacturing yield, and/or reduces manufacturing costs.

Figure 10:
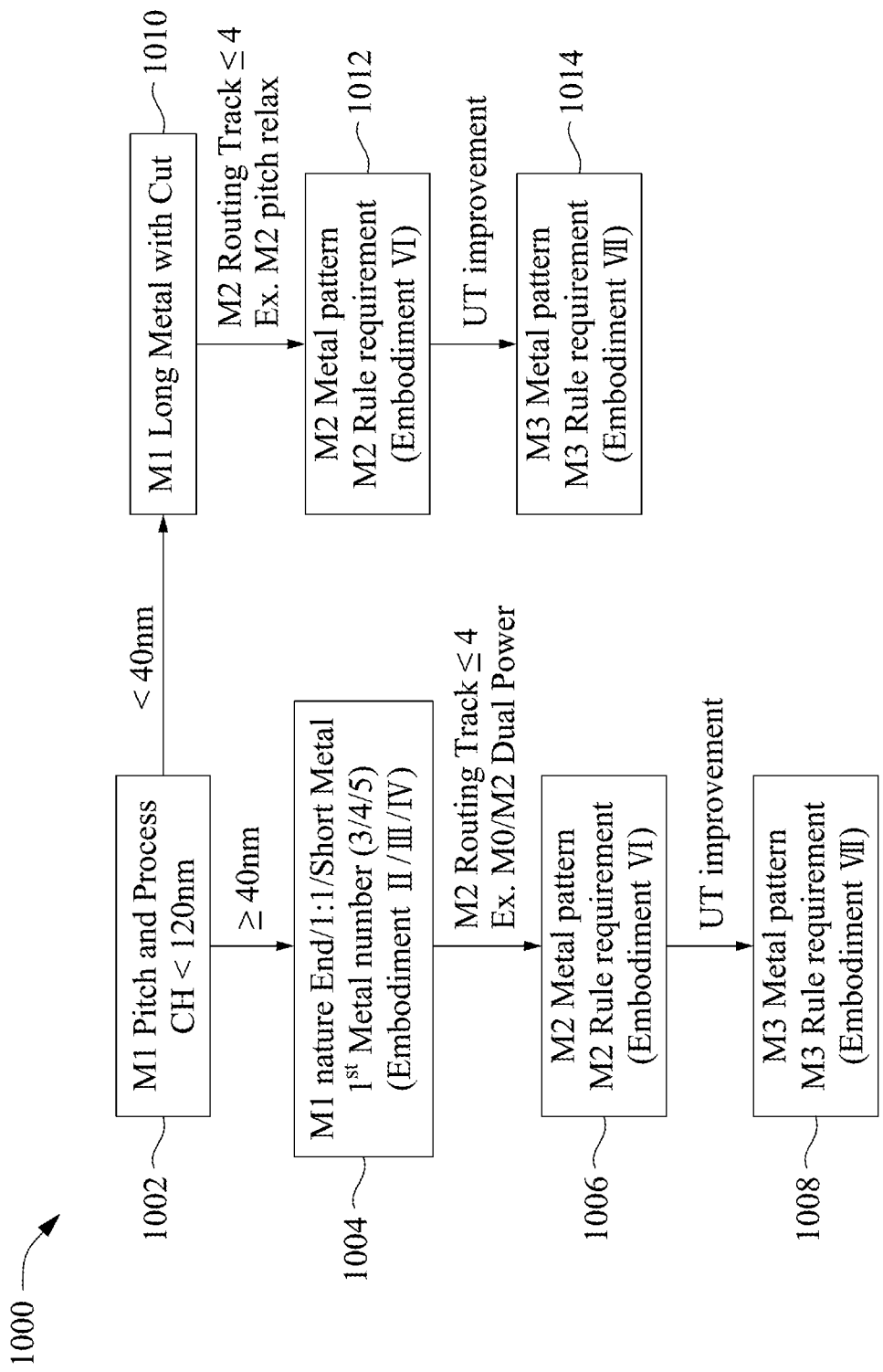
FIG. 10 illustrates a flow chart of a method of forming an integrated circuit according to a layout design.

FIG. 10 illustrates a flow chart of a method 1000 of forming an integrated circuit according to a layout design. Additional, fewer, or different operations may be performed in the method 1000 depending on the embodiment. The method 1000 is applicable to the circuits and systems of FIGS. 1-9, but is also applicable to other suitable circuits and systems. The method 1000 can be implemented using a processor, device, or component, e.g., of a fabrication facility, or any suitable processor, device, or component for forming integrated circuits.

The processor determines whether the M1 pitch (e.g., the M1 pitch 702) is less than a threshold pitch, e.g., 40 nm (1002). If the M1 pitch is less than the threshold pitch, the processor forms M1 metal tracks (e.g., the metal tracks 701A-701E) by using a nature end process based on a short metal pattern (1004). The processor forms M2 metal tracks (e.g., 703A-703D, 901A-901F) using an M2 metal pattern and M2 rule requirements (1006). The processor forms M3 metal tracks (e.g., 903A-903B) using an M3 metal pattern and M3 rule requirements (1008). If the M1 pitch is greater than the threshold pitch, the processor forms the M1 metal tracks using a cut process based on a long metal pattern (1010). The processor forms M2 metal tracks using an M2 metal pattern and M2 rule requirements (1012). The processor forms M3 metal tracks using an M2 metal pattern and M3 rule requirements (1014).

FIG. 11 illustrates a flow chart of a method 1100 of forming an integrated circuit according to a layout design. Additional, fewer, or different operations may be performed in the method 1100 depending on the embodiment. The method 1100 is applicable to the circuits and systems of FIGS. 1-9, but is also applicable to other suitable circuits and systems. The method 1100 can be implemented using a processor, device, or component, e.g., of a fabrication facility, or any suitable processor, device, or component for forming integrated circuits.

A processor forms a first pattern metal layer (e.g., M0 layer of FIG. 2, FIG. 3A, etc.) including a plurality of metal tracks (e.g., 201A-201H, 301A-301G, etc.) extending in a first direction, wherein each of the plurality of metal tracks separated from its adjacent one of the plurality of metal tracks by a first pitch (e.g., first M0 pitch of FIG. 3A, etc.) (1102). A pattern metal layer can be referred to as a patterned metal layer. The processor forms a second pattern metal layer (e.g., M2 layer of FIG. 1, etc.) formed over the first pattern metal layer, wherein the second pattern metal layer includes a second plurality of metal tracks (e.g., 101B-101E, 101A-101E, two adjacent cells with each cell comprising 101B-101E, two adjacent cells with each cell comprising 101A-101F, etc.) extending in the first direction, wherein each of the second plurality of metal tracks is separated from its adjacent one of the second plurality of metal tracks by a second pitch (e.g., 103) (1104). In some embodiments, the second plurality of metal tracks is less than 9. The processor forms a third pattern metal layer disposed between the first pattern metal layer and the second pattern metal layer, the third pattern metal layer (e.g., M1 layer of FIG. 2, FIG. 3A, etc.) including a first metal track segment (e.g., 203A, 303A, 303C, 303E, 303G, 303I, 303K, 303N, 303Q, 303T, 303V, 303Y, 303AB, etc.) extending in the second direction, a second metal track segment (e.g., 203B, 303B, 303D, 303F, 303H, 303I, 303L, 303O, 303R, 303U, 303W, 303Z, 303AC, etc.) extending in the second direction, wherein the second metal track segment is shifted in a second direction from the first metal track segment (1106). In some embodiments, the third pattern metal layer includes a third metal track segment (e.g., 203C, 303M, 303P, 303S, 303X, 303AA, etc.) extending in the second direction, wherein the third metal track segment shifted in a second direction from the first and second metal track segments. The integrated circuit is defined by a double cell height (e.g., 206) in the second direction. In some embodiments, each of the plurality of metal tracks, the second plurality of metal tracks, and at least a portion of each of the first metal track segment, and the second metal track segment are within the double cell height. In some embodiments, the third metal track segment is within the double cell height. In some embodiments, the double cell height is less than or equal to 240 nm.

In some embodiments, the third pattern metal layer is formed using a nature end process. In some embodiments, the third pattern metal layer is formed using one mask/pattern (e.g., 1P1E). In some embodiments, the third pattern metal layer is formed using more than one mask/pattern (e.g., LSLE). In some embodiments, the third pattern metal layer is an M1 layer.

In some embodiments, the second pattern metal layer is formed using a cut process. In some embodiments, the second pattern metal layer is formed using one mask/pattern (e.g., 1P1E). In some embodiments, the second pattern metal layer is formed using more than one mask/pattern (e.g., LSLE). In some embodiments, the second pattern metal layer is an M2 layer.

Figure 12:
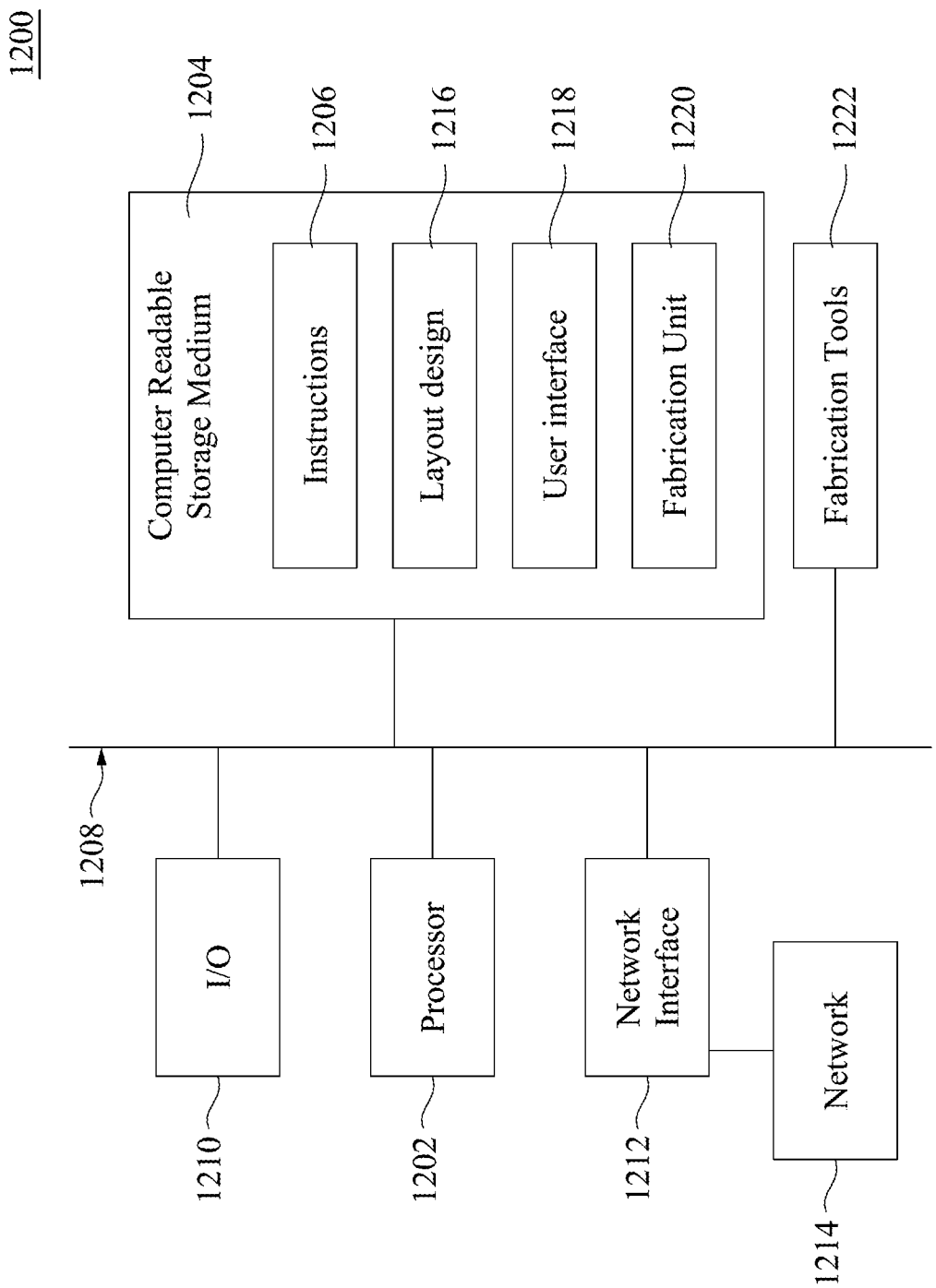
FIG. 12 is a schematic view of a system for designing and manufacturing an IC layout design in accordance with some embodiments.

FIG. 12 is a schematic view of a system 1200 for designing and manufacturing an IC layout design in accordance with some embodiments. In some embodiments, system 1200 generates or places one or more IC layout designs described herein. In some embodiments, the system 1200 manufactures one or more ICs based on the one or more IC layout designs described herein. The system 1200 includes a hardware processor 1202 and a non-transitory, computer readable storage medium 1204 encoded with, e.g., storing, the computer program code 1206, e.g., a set of executable instructions. Computer readable storage medium 1204 is configured for interfacing with manufacturing machines for producing the integrated circuit. The processor 1202 is electrically coupled to the computer readable storage medium 1204 by a bus 1208. The processor 1202 is also electrically coupled to an I/O interface 1210 by bus 1208. A network interface 1212 is also electrically connected to the processor 1202 by bus 1208. Network interface 1212 is connected to a network 1214, so that processor 1202 and computer readable storage medium 1204 are capable of connecting to external elements via network 1214. The processor 1202 is configured to execute the computer program code 1206 encoded in the computer readable storage medium 1204 in order to cause system 1200 to be usable for performing a portion or all of the operations as described in method 1000 or 1100.

In some embodiments, the processor 1202 is a central processing unit (CPU), a multi-processor, a distributed processing system, an application specific integrated circuit (ASIC), and/or a suitable processing unit.

In some embodiments, the computer readable storage medium 1204 is an electronic, magnetic, optical, electromagnetic, infrared, and/or a semiconductor system (or apparatus or device). For example, the computer readable storage medium 1204 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1204 includes a compact disk-read only memory (CD-ROM), a compact disk-read/write (CD-R/W), and/or a digital video disc (DVD).

In some embodiments, the storage medium 1204 stores the computer program code 1206 configured to cause system 1200 to perform method 1000 or 1100. In some embodiments, the storage medium 1204 also stores information needed for performing method 1000 or 1100 as well as information generated during performance of method 1000 or 1100, such as layout design 1216 and user interface 1218 and fabrication unit 1220, and/or a set of executable instructions to perform the operation of method 1000 or 1100. In some embodiments, layout design 1216 comprises one or more layout patterns for one of the layout designs 100-900.

In some embodiments, the storage medium 1204 stores instructions (e.g., computer program code 1206) for interfacing with manufacturing machines. The instructions (e.g., computer program code 1206) enable processor 1202 to generate manufacturing instructions readable by the manufacturing machines to effectively implement method 1000 or 1100 during a manufacturing process.

System 1200 includes I/O interface 1210. I/O interface 1210 is coupled to external circuitry. In some embodiments, I/O interface 1210 includes a keyboard, keypad, mouse, trackball, trackpad, and/or cursor direction keys for communicating information and commands to processor 1202.

System 1200 also includes network interface 1212 coupled to the processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interface such as ETHERNET, USB, or IEEE-13154. In some embodiments, method 1000 or 1100 is implemented in two or more systems 1200, and information such as layout design, user interface and fabrication unit are exchanged between different systems 1200 by network 1214.

System 1200 is configured to receive information related to a layout design through I/O interface 1210 or network interface 1212. The information is transferred to processor 1202 by bus 1208 to determine a layout design for producing an IC. The layout design is then stored in computer readable medium 1204 as layout design 1216. System 1200 is configured to receive information related to a user interface through I/O interface 1210 or network interface 1212. The information is stored in computer readable medium 1204 as user interface 1218. System 1200 is configured to receive information related to a fabrication unit through I/O interface 1210 or network interface 1212. The information is stored in computer readable medium 1204 as fabrication unit 1220. In some embodiments, the fabrication unit 1220 includes fabrication information utilized by system 1200.

In some embodiments, the system 1200 may also be associated with various fabrication tools 1222. Among other things, the fabrication tools 1222 may be used to prepare and fabricate a set of masks based on the standard cell layout (e.g., layouts of FIGS. 1-9) created by a standard cell layout application. The set of masks may define the geometry for the photolithography steps used during semiconductor fabrication of the circuit.

To prepare a set of masks, the fabrication tools 1222 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 1222 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

In some embodiments, method 1000 or 1100 is implemented as a standalone software application for execution by a processor. In some embodiments, method 1000 or 1100 is implemented as a software application that is a part of an additional software application. In some embodiments, method 1000 or 1100 is implemented as a plug-in to a software application. In some embodiments, method 1000 or 1100 is implemented as a software application that is a portion of an EDA tool. In some embodiments, method 1000 or 1100 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 1000 or 1100 is implemented by a manufacturing device to manufacture an integrated circuit using a set of masks manufactured based on one or more layout designs generated by system 1200. In some embodiments, system 1200 is a manufacturing device to manufacture an integrated circuit using a set of masks manufactured based on one or more layout designs of the present disclosure. In some embodiments, system 1200 of FIG. 12 generates layout designs of an IC that are smaller than other approaches. In some embodiments, system 1200 of FIG. 12 generates layout designs of an IC that occupy less area than other approaches.

Figure 13:
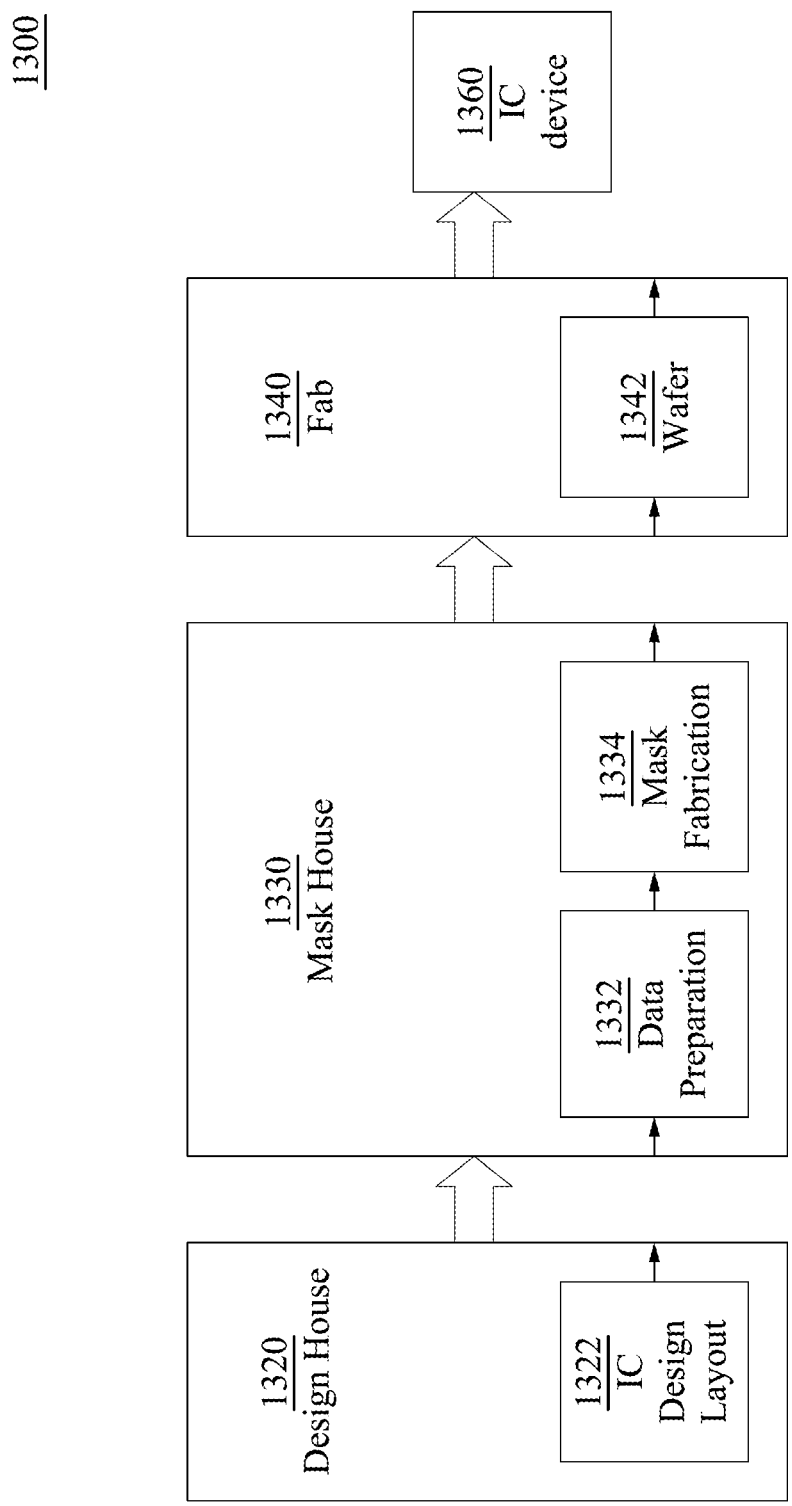
FIG. 13 is a block diagram of an integrated circuit (IC) manufacturing system, and an IC manufacturing flow associated therewith, in accordance with at least one embodiment of the present disclosure.

FIG. 13 is a block diagram of an integrated circuit (IC) manufacturing system 1300, and an IC manufacturing flow associated therewith, in accordance with at least one embodiment of the present disclosure.

In FIG. 13, IC manufacturing system 1300 includes entities, such as a design house 1320, a mask house 1330, and an IC manufacturer/fabricator ("fab") 1340, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1340 is owned by a single larger company. In some embodiments, two or more of design house 1320, mask house 1330, and IC fab 1340 coexist in a common facility and use common resources.

Design house (or design team) 1320 generates an IC design layout 1322. IC design layout 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout 1322 includes various IC features, such as an active region, gate electrode, source electrode and drain electrode, metal lines or via contacts of an interlayer interconnection, and openings for bonding pads, to be formed in a semiconductor substrate (such as a silicon wafer) and various material layers disposed on the semiconductor substrate. Design house 1320 implements a proper design procedure to form IC design layout 1322. The design procedure includes one or more of logic design, physical design or place and route. IC design layout 1322 is presented in one or more data files having information of the geometrical patterns. For example, IC design layout 1322 can be expressed in a GDSII file format or DFII file format.

Mask house 1330 includes mask data preparation 1332 and mask fabrication 1334. Mask house 1330 uses IC design layout 1322 to manufacture one or more masks to be used for fabricating the various layers of IC device 1360 according to IC design layout 1322. Mask house 1330 performs mask data preparation 1332, where IC design layout 1322 is translated into a representative data file ("RDF"). Mask data preparation 1332 provides the RDF to mask fabrication 1334. Mask fabrication 1334 includes a mask writer. A mask writer converts the RDF to an image on a substrate, such as a mask (reticle) or a semiconductor wafer. The design layout is manipulated by mask data preparation 1332 to comply with particular characteristics of the mask writer and/or requirements of IC fab 1340. In FIG. 13, mask data preparation 1332 and mask fabrication 1334 are illustrated as separate elements. In some embodiments, mask data preparation 1332 and mask fabrication 1334 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1334, which may undo part of the modifications performed by OPC in order to meet mask creation rules.

In some embodiments, mask data preparation 1332 includes lithography process checking (LPC) that simulates processing that will be implemented by IC fab 1340 to fabricate IC device 1360. LPC simulates this processing based on IC design layout 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1322.

It should be understood that the above description of mask data preparation 1332 has been simplified for the purposes of clarity. In some embodiments, mask data preparation 1332 includes additional features such as a logic operation (LOP) to modify the IC design layout according to manufacturing rules. Additionally, the processes applied to IC design layout 1322 during mask data preparation 1332 may be executed in a variety of different orders.

After mask data preparation 1332 and during mask fabrication 1334, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1334 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1340 is an IC fabrication entity that includes one or more manufacturing facilities for the fabrication of a variety of different IC products. In some embodiments, IC fab 1340 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1340 uses the mask (or masks) fabricated by mask house 1330 to fabricate IC device 1360. Thus, IC fab 1340 at least indirectly uses IC design layout 1322 to fabricate IC device 1360. In some embodiments, a semiconductor wafer 1342 is fabricated by IC fab 1340 using the mask (or masks) to form IC device 1360. Semiconductor wafer 1342 includes a silicon substrate or other proper substrate having material layers formed thereon. Semiconductor wafer further includes one or more of various doped regions, dielectric features, multilevel interconnects, and the like (formed at subsequent manufacturing steps).

System 1300 is shown as having design house 1320, mask house 1330 or IC fab 1340 as separate components or entities. However, it is understood that one or more of design house 1320, mask house 1330 or IC fab 1340 are part of the same component or entity.

One aspect of this description relates to an integrated circuit. In some aspects, the integrated circuit includes a first pattern metal layer including a plurality of metal tracks extending in a first direction, wherein each of the plurality of metal tracks is separated from its adjacent one of the plurality of metal tracks by a first pitch, a second pattern metal layer disposed over the first pattern metal layer, wherein the second pattern metal layer includes a second plurality of metal tracks extending in the first direction and wherein each of the second plurality of metal tracks is separated from its adjacent one of the second plurality of metal tracks by a second pitch, a third pattern metal layer disposed between the first pattern metal layer and the second pattern metal layer, the third pattern metal layer including a first metal track segment extending in a second direction perpendicular to the first direction, wherein the first metal track segment is overlapping at least a first one of the plurality of metal tracks of the first pattern metal layer, wherein the first metal track segment has a first edge extending in the first direction, a second metal track segment extending in the second direction, wherein the second metal track segment is overlapping at least a second one of the plurality of metal tracks of the first pattern metal layer, wherein the second metal track segment has a second edge facing the first edge of the first metal track segment and wherein the second metal track has a third edge opposite the second edge, wherein the integrated circuit is defined by a double cell height in the second direction and wherein each of the plurality of metal tracks, the second plurality of metal tracks, and at least a portion of each of the first metal track segment and the second metal track segment are within the double cell height.

In some aspects, the double cell height is less than or equal to 240 nm. In some aspects, the first edge of the first metal track segment and the second edge of the second metal track segment are separated by a distance along the second direction, a ratio of the distance and the first pitch is less than or equal to a predetermined threshold. In some aspects, the predetermined threshold is 1.

In some aspects, the integrated circuit further includes a pattern via layer disposed between the first pattern metal layer and the third pattern metal layer, the pattern via layer including a first via coupling the first metal track segment of the third pattern metal layer to the first one of the plurality of metal tracks of the first pattern metal layer, and a second via coupling the second metal track segment of the third pattern metal layer to the second one of the plurality of metal tracks of the first pattern metal layer. In some aspects, the first one of the plurality of metal tracks and the second one of the plurality of metal tracks are configured for signal connection. In some aspects, the first one of the plurality of metal tracks is configured for signal connection and the second one of the plurality of metal tracks is configured for power or ground connection. In some aspects, the first one of the plurality of metal tracks has a first width less than a second width of the second one of the plurality of metal tracks.

In some aspects, a plurality of pitches includes the first pitch for each of the plurality of metal tracks, the plurality of pitches is less than the double cell height. In some aspects, the integrated circuit further includes a third metal track segment extending in the second direction, wherein the third metal track segment is overlapping at least a third one of the plurality of metal tracks of the first pattern metal layer, wherein the third metal track segment has a fourth edge facing the third edge of the second metal track segment, wherein the third metal track segment is within the double cell height In some aspects, the integrated circuit further includes a pattern poly layer including a plurality of poly tracks extending in the second direction, wherein each of the plurality of poly tracks is separated from its adjacent one of the plurality of poly tracks by a poly pitch, wherein each of the second plurality of metal tracks includes a plurality of metal track segments, wherein at least one of the plurality of metal track segments has a length in the first direction, and wherein a ratio of the length and the poly pitch less than a second predetermined threshold.

In some aspects, the integrated circuit further includes a fourth pattern metal layer disposed over the second pattern metal layer, wherein the fourth pattern metal layer includes a fourth metal track segment extending in the second direction, the fourth metal track segment having a length in the second direction, a ratio of the length and the cell height less than a second predetermined threshold.

One aspect of this description relates to a method for forming an integrated circuit. In some aspects, the method includes forming a first pattern metal layer including a plurality of metal tracks extending in a first direction, wherein each of the plurality of metal tracks is separated from its adjacent one of the plurality of metal tracks by a first pitch, forming a second pattern metal layer formed over the first pattern metal layer, wherein the second pattern metal layer includes a second plurality of metal tracks extending in the first direction, wherein each of the second plurality of metal tracks is separated from its adjacent one of the second plurality of metal tracks by a second pitch, forming a third pattern metal layer disposed between the first pattern metal layer and the second pattern metal layer, the third pattern metal layer including a first metal track segment extending in a second direction perpendicular to the first direction, and a second metal track segment extending in the second direction, wherein the second metal track segment is shifted in the second direction from the first metal track segment, wherein the integrated circuit is defined by a double cell height in the second direction and wherein each of the plurality of metal tracks, the second plurality of metal tracks, and at least a portion of each of the first metal track segment and the second metal track segment are within the double cell height.

In some aspects, the third pattern metal layer is formed using less than two masks. In some aspects, the third pattern metal layer is formed using at least two masks, one of the masks defines a plurality of locations where to cut the third pattern metal layer. In some aspects, the second pattern metal layer is formed using less than two masks. In some aspects, the second pattern metal layer is formed using at least two masks, one of the masks defines a plurality of locations where to cut the second pattern metal layer. In some aspects, the double cell height is less than or equal to 240 nm.

One aspect of this description relates to an integrated circuit. In some aspects, the integrated circuit includes a first pattern metal layer including a plurality of metal tracks extending in a first direction, wherein each of the plurality of metal tracks is separated from its adjacent one of the plurality of metal tracks by a first pitch, a second pattern metal layer disposed under the first pattern metal layer, the second pattern metal layer including a first metal track segment extending in a second direction perpendicular to the first direction, wherein the first metal track segment has a first edge extending in the first direction, and a second metal track segment extending in the second direction, wherein the second metal track segment has a second edge facing the first edge of the first metal track segment and wherein the second metal track has a third edge opposite the second edge, wherein the integrated circuit is within a pair of standard cells, wherein each of the pair of standard cells are disposed over transistors with effective gate lengths no greater than 2 nanometers.

In some aspects, the integrated circuit further includes a third pattern metal layer disposed under the second pattern metal layer, the third pattern metal layer including a second plurality of metal tracks extending in the first direction, wherein each of the plurality of metal tracks separated from its adjacent one of the plurality of metal tracks by a second pitch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first pattern metal layer comprising a plurality of metal tracks extending in a first direction, wherein each of the plurality of metal tracks is separated from its adjacent one of the plurality of metal tracks by a first pitch;
a second pattern metal layer disposed over the first pattern metal layer, wherein the second pattern metal layer comprises a second plurality of metal tracks extending in the first direction and wherein each of the second plurality of metal tracks is separated from its adjacent one of the second plurality of metal tracks by a second pitch;
a third pattern metal layer disposed between the first pattern metal layer and the second pattern metal layer, the third pattern metal layer comprising:
a first metal track segment extending in a second direction perpendicular to the first direction, wherein the first metal track segment is overlapping at least a first one of the plurality of metal tracks of the first pattern metal layer, wherein the first metal track segment has a first edge extending in the first direction;
a second metal track segment extending in the second direction, wherein the second metal track segment is overlapping at least a second one of the plurality of metal tracks of the first pattern metal layer, wherein the second metal track segment has a second edge facing the first edge of the first metal track segment and wherein the second metal track has a third edge opposite the second edge;
wherein the integrated circuit is defined by a double cell height in the second direction and wherein each of the plurality of metal tracks, the second plurality of metal tracks, and at least a portion of each of the first metal track segment and the second metal track segment are within the double cell height.

2. The integrated circuit of claim 1, wherein the double cell height is less than or equal to 240 nm.

3. The integrated circuit of claim 1, wherein the first edge of the first metal track segment and the second edge of the second metal track segment are separated by a distance along the second direction, wherein a ratio of the distance and the first pitch is less than or equal to a predetermined threshold.

4. The integrated circuit of claim 3, wherein the predetermined threshold is 1.

5. The integrated circuit of claim 1, further comprising:
a pattern via layer disposed between the first pattern metal layer and the third pattern metal layer, the pattern via layer comprising:
a first via coupling the first metal track segment of the third pattern metal layer to the first one of the plurality of metal tracks of the first pattern metal layer; and
a second via coupling the second metal track segment of the third pattern metal layer to the second one of the plurality of metal tracks of the first pattern metal layer.

6. The integrated circuit of claim 5, wherein the first one of the plurality of metal tracks and the second one of the plurality of metal tracks are configured for signal connection.

7. The integrated circuit of claim 5, wherein the first one of the plurality of metal tracks is configured for signal connection and the second one of the plurality of metal tracks is configured for power or ground connection.

8. The integrated circuit of claim 7, wherein the first one of the plurality of metal tracks has a first width less than a second width of the second one of the plurality of metal tracks.

9. The integrated circuit of claim 1, wherein a plurality of pitches comprises the first pitch for each of the plurality of metal tracks, wherein the plurality of pitches is less than the double cell height.

10. The integrated circuit of claim 1, further comprising a third metal track segment extending in the second direction, wherein the third metal track segment is overlapping at least a third one of the plurality of metal tracks of the first pattern metal layer, wherein the third metal track segment has a fourth edge facing the third edge of the second metal track segment, wherein the third metal track segment is within the double cell height.

11. The integrated circuit of claim 1, further comprising:
a pattern poly layer comprising a plurality of poly tracks extending in the second direction, wherein each of the plurality of poly tracks is separated from its adjacent one of the plurality of poly tracks by a poly pitch, wherein each of the second plurality of metal tracks comprises a plurality of metal track segments, wherein at least one of the plurality of metal track segments has a length in the first direction, and wherein a ratio of the length and the poly pitch is less than a second predetermined threshold.

12. The integrated circuit of claim 1, further comprising:
a fourth pattern metal layer disposed over the second pattern metal layer, wherein the fourth pattern metal layer comprises a fourth metal track segment extending in the second direction, the fourth metal track segment having a length in the second direction, a ratio of the length and the cell height is less than a second predetermined threshold.

13. An integrated circuit comprising:
a first pattern metal layer comprising a plurality of metal tracks extending in a first direction, wherein each of the plurality of metal tracks is separated from its adjacent one of the plurality of metal tracks by a first pitch;
a second pattern metal layer disposed under the first pattern metal layer, the second pattern metal layer comprising:
a first metal track segment extending in a second direction perpendicular to the first direction, wherein the first metal track segment has a first edge extending in the first direction; and
a second metal track segment extending in the second direction, wherein the second metal track segment has a second edge facing the first edge of the first metal track segment and wherein the second metal track has a third edge opposite the second edge;
wherein the integrated circuit is within a pair of standard cells, wherein each of the pair of standard cells are disposed over transistors with effective gate lengths no greater than 2 nanometers.

14. The integrated circuit of claim 13, further comprising a third pattern metal layer disposed under the second pattern metal layer, the third pattern metal layer comprising a second plurality of metal tracks extending in the first direction, wherein each of the plurality of metal tracks separated from its adjacent one of the plurality of metal tracks by a second pitch.

15. An integrated circuit comprising:
a first pattern metal layer including a plurality of metal tracks extending in a first direction, wherein each of the plurality of metal tracks is separated from its adjacent one of the plurality of metal tracks by a first pitch;
a second pattern metal layer disposed over the first pattern metal layer and including a second plurality of metal tracks extending in the first direction and wherein each of the second plurality of metal tracks is separated from its adjacent one of the second plurality of metal tracks by a second pitch;
a third pattern metal layer disposed between the first pattern metal layer and the second pattern metal layer, the third pattern metal layer comprising:
a first metal track segment extending in a second direction perpendicular to the first direction, wherein the first metal track segment is overlapping at least a first one of the plurality of metal tracks of the first pattern metal layer;
a second metal track segment extending in the second direction, wherein the second metal track segment is overlapping at least a second one of the plurality of metal tracks of the first pattern metal layer;
wherein the integrated circuit is defined by a double cell height in the second direction and wherein each of the plurality of metal tracks, the second plurality of metal tracks, and at least a portion of each of the first metal track segment and the second metal track segment are within the double cell height.

16. The integrated circuit of claim 15, wherein the double cell height is no greater than 240 nm.

17. The integrated circuit of claim 15, wherein a first edge of the first metal track segment and a second edge of the second metal track segment are separated by a distance along the second direction.

18. The integrated circuit of claim 17, wherein a ratio of the distance and the first pitch is less than or equal to a predetermined threshold of 1.

19. The integrated circuit of claim 15, further comprising:
a pattern via layer disposed between the first pattern metal layer and the third pattern metal layer, the pattern via layer comprising:
a first via coupling the first metal track segment of the third pattern metal layer to the first one of the plurality of metal tracks of the first pattern metal layer; and
a second via coupling the second metal track segment of the third pattern metal layer to the second one of the plurality of metal tracks of the first pattern metal layer.

20. The integrated circuit of claim 19, wherein the first one of the plurality of metal tracks and the second one of the plurality of metal tracks are configured for signal connection.

* * * * *